United States Patent
Izumida et al.

(10) Patent No.: US 9,748,312 B2
(45) Date of Patent: Aug. 29, 2017

(54) SEMICONDUCTOR MEMORY DEVICE

(71) Applicant: Kabushiki Kaisha Toshiba, Minato-ku (JP)

(72) Inventors: Takashi Izumida, Yokohama (JP); Hikari Tajima, Mitaka (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/072,748

(22) Filed: Mar. 17, 2016

(65) Prior Publication Data

US 2017/0125482 A1    May 4, 2017

Related U.S. Application Data

(60) Provisional application No. 62/247,973, filed on Oct. 29, 2015.

(51) Int. Cl.
*H01L 27/24* (2006.01)
*H01L 45/00* (2006.01)
*H01L 23/528* (2006.01)
*H01L 29/423* (2006.01)

(52) U.S. Cl.
CPC .......... *H01L 27/249* (2013.01); *H01L 23/528* (2013.01); *H01L 27/2436* (2013.01); *H01L 29/42376* (2013.01); *H01L 45/085* (2013.01)

(58) Field of Classification Search
None
See application file for complete search history.

(56) References Cited

U.S. PATENT DOCUMENTS

| 8,278,170 | B2 | 10/2012 | Lee et al. |
| 8,299,571 | B2 | 10/2012 | Ozawa et al. |
| 8,822,971 | B2 | 9/2014 | Park et al. |
| 8,912,521 | B2 | 12/2014 | Nojiri et al. |
| 2015/0014622 | A1 | 1/2015 | Kanno et al. |
| 2015/0117089 | A1 | 4/2015 | Minemura et al. |

FOREIGN PATENT DOCUMENTS

| JP | 2011-129639 | 6/2011 |
| JP | 2012-15517 | 1/2012 |
| JP | 2013-115436 | 6/2013 |
| JP | 2014-103373 | 6/2014 |
| JP | 2015-19048 | 1/2015 |
| JP | 2015-88212 | 5/2015 |

*Primary Examiner* — Whitney T Moore
(74) *Attorney, Agent, or Firm* — Oblon, McClelland, Maier & Neustadt, L.L.P.

(57) ABSTRACT

According to an embodiment, a semiconductor memory device comprises: a first semiconductor layer extending in a first direction; a first wiring line extending in a second direction intersecting the first direction; a variable resistance layer provided between these first wiring line and first semiconductor layer; and a first gate electrode extending in the first direction and facing the first semiconductor layer via a first insulating layer. In addition, this semiconductor memory device comprises a second gate electrode provided in the first direction with respect to the first wiring line, extending in the second direction in parallel to the first wiring line, and facing the first semiconductor layer. This second gate electrode faces the first semiconductor layer via a second insulating layer. Moreover, this second gate electrode faces the first gate electrode via the second insulating layer, the first semiconductor layer, and the first insulating layer.

20 Claims, 35 Drawing Sheets

SEMICONDUCTOR MEMORY DEVICE

CROSS-REFERENCE TO RELATED APPLICATIONS

This application is based upon and claims the benefit of U.S. Provisional Patent Application No. 62/247,973, filed on Oct. 29, 2015, the entire contents of which are incorporated herein by reference.

FIELD

Embodiments described herein relate to a semiconductor memory device.

BACKGROUND

Description of the Related Art

A resistance varying type memory (ReRAM: Resistive RAM), and so on, that can easily be made three-dimensional, has been receiving attention as a memory utilized for storing large capacity data. In such a memory, a variable resistance element is employed as a storage element. The following are employed as such a variable resistance element, for example, CBRAM (Conduction Bridge RAM), a storage element utilizing the likes of a chalcogenide compound or metal oxide, an MRAM element employing a resistance change due to a tunnel magnetoresistance effect, a storage element utilizing a conductive polymer (polymer ferroelectric RAM, PFRAM), and so on.

DETAILED DESCRIPTION

A semiconductor memory device according to an embodiment comprises: a first semiconductor layer extending in a first direction; a first wiring line extending in a second direction intersecting the first direction; a variable resistance layer provided between these first wiring line and first semiconductor layer; and a first gate electrode extending in the first direction and facing the first semiconductor layer via a first insulating layer. In addition, this semiconductor memory device comprises a second gate electrode provided in the first direction with respect to the first wiring line, extending in the second direction in parallel to the first wiring line, and facing the first semiconductor layer. This second gate electrode faces the first semiconductor layer via a second insulating layer. Moreover, this second gate electrode faces the first gate electrode via the second insulating layer, the first semiconductor layer, and the first insulating layer.

Next, nonvolatile semiconductor memory devices according to embodiments will be described in detail with reference to the drawings. Note that these embodiments are merely examples, and are not shown with the intention of limiting the present invention.

For example, each of the drawings of the nonvolatile semiconductor memory devices employed in the embodiments below is schematic, and thicknesses, widths, ratios, and so on, of layers are different from those of the actual nonvolatile semiconductor memory devices.

Moreover, described herein is an example in which a variable resistance element employing a metal oxide is adopted as a storage element, but the present invention may also be applied to a memory device having another configuration. Such a memory device may have any configuration, for example, may be a memory device that employs CBRAM (Conduction Bridge RAM) comprising a layer which is a supply source of a metal ion and a layer which is a medium in which the metal ion moves, may be a memory device that employs a storage element utilizing a chalcogenide compound, and so on.

Semiconductor Memory Device according to First Embodiment

Figure 1:
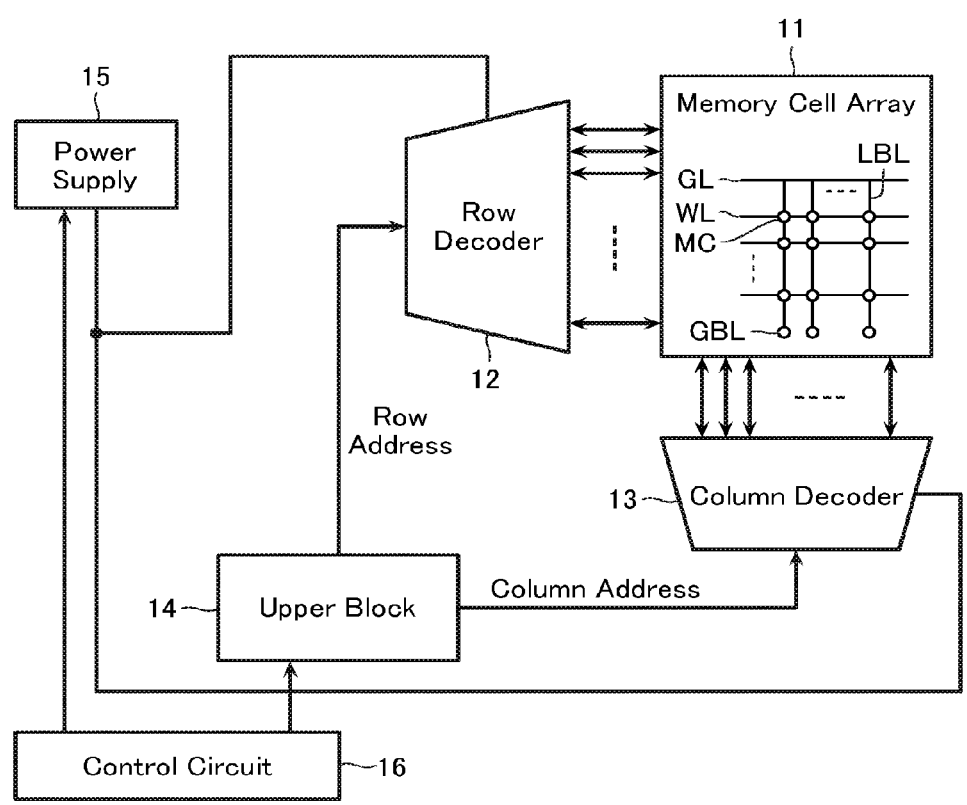
FIG. 1 is a block diagram of a nonvolatile semiconductor memory device according to a first embodiment.

First, an overall configuration of a semiconductor memory device according to a first embodiment will be described with reference to FIG. 1. FIG. 1 is a block diagram of a nonvolatile semiconductor memory device according to the first embodiment. The same nonvolatile semiconductor memory device stores user data inputted from an unillustrated external host, in a specified address in a memory cell array 11. In addition, the same nonvolatile semiconductor memory device reads user data from a specified address in the memory cell array 11, and outputs the user data to the external host.

That is, as shown in FIG. 1, the same nonvolatile semiconductor memory device comprises the memory cell array 11. The memory cell array 11 comprises a plurality of memory cells MC each storing one bit or multiple bits of data. Moreover, the memory cell array 11 is configured capable of access (data erase/write/read) to a desired memory cell MC by applying a certain voltage to a desired global bit line GBL, word line WL, and gate line GL, according to address data.

In addition, as shown in FIG. 1, the same nonvolatile semiconductor memory device comprises a row decoder 12. The row decoder 12, during access, selects one word line WL and the gate line GL according to a row address, and applies a certain voltage to the word line WL and gate line GL.

In addition, as shown in FIG. 1, the same nonvolatile semiconductor memory device comprises a column decoder 13. The column decoder 13, during access, selects one or a plurality of global bit lines GBL according to a column address, and applies a certain voltage to the one or plurality of global bit lines GBL. Moreover, the column decoder 13 comprises a sense amplifier circuit, and by detecting a current or voltage of the global bit line GBL, determines user data recorded in the memory cell MC.

In addition, as shown in FIG. 1, the same nonvolatile semiconductor memory device comprises a higher block decoder 14. The higher block decoder 14 generates the row address and the column address according to the address data, and supplies the row address and the column address to the row decoder 12 and the column decoder 13.

In addition, as shown in FIG. 1, the same nonvolatile semiconductor memory device comprises a power supply 15. The power supply 15 generates certain combinations of voltages corresponding to each of operations of data erase/write/read, and supplies these voltages to the row decoder 12 and the column decoder 13.

In addition, as shown in FIG. 1, the same nonvolatile semiconductor memory device comprises a control circuit 16. The control circuit 16 receives an external control signal from the unillustrated external host, and performs control of the higher block decoder 14 or power supply 15, and so on.

Figure 2:
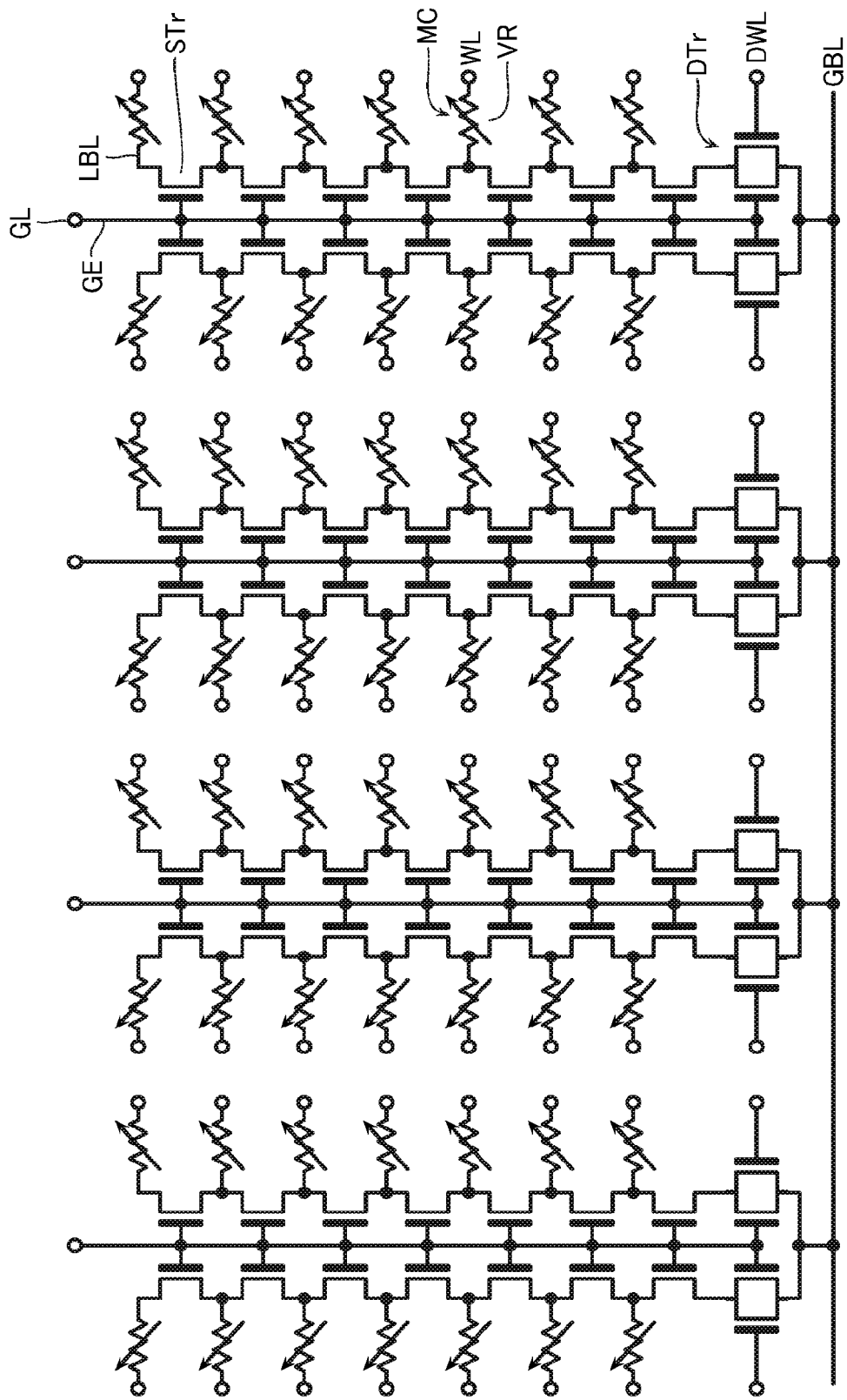
FIG. 2 is a circuit diagram showing a configuration of part of the same nonvolatile semiconductor memory device.

Next, a circuit configuration of part of the memory cell array 11 according to the present embodiment will be described with reference to FIG. 2. FIG. 2 is an equivalent circuit diagram showing a configuration of part of the memory cell array 11.

As shown in FIG. 2, the memory cell array 11 comprises the plurality of memory cells MC. As mentioned above, these memory cells MC store one bit or multiple bits of data. That is, these memory cells MC include a variable resistance element VR, and it is assumed that, for example, when the variable resistance element VR is in a low resistance state, the memory cell MC is recording "1", and when the variable resistance element VR is in a high resistance state, the memory cell MC is recording "0".

In addition, as shown in FIG. 2, the memory cell array 11 is configured capable of access (data erase/write/read) to a desired memory cell MC by applying a certain voltage to a desired global bit line GBL, word line WL, and gate line GL, according to address data.

That is, as shown in FIG. 2, the memory cell array 11 comprises: the global bit line GBL; a plurality of local bit lines LBL connected to this global bit line GBL; the plurality of memory cells MC (variable resistance elements VR) connected to this local bit line LBL; and a plurality of the word lines WL respectively connected to these plurality of memory cells MC. Moreover, as shown in FIG. 2, the memory cell array 11 comprises: a gate electrode GE (first gate electrode) corresponding to each of the local bit lines LBL; and a gate line GL connected to this gate electrode GE. As shown in FIG. 2, the local bit line LBL, together with the gate electrode GE, configures a select transistor STr.

In addition, as shown in FIG. 2, the memory cell array 11 comprises a dummy word line DWL (second gate electrode) facing the local bit line LBL. The dummy word line DWL, together with the local bit line LBL, configures a dummy transistor DTr. The dummy transistor DTr is a field effect type transistor adopting part of the local bit line LBL as its channel body and adopting part of the dummy word line DWL as its control gate electrode. Moreover, the dummy transistor DTr is connected between the plurality of memory cells MC and the global bit line GBL.

When performing access to the memory cell MC, a voltage is applied to the gate electrode GE via the gate line GL corresponding to this memory cell MC, and the select transistor STr corresponding to the local bit line LBL connected to this memory cell MC is set to an ON state. Applying a voltage between the global bit line GBL and a selected word line WL connected to the memory cell MC in this state makes it possible for a voltage to be selectively applied to a desired memory cell MC or for a current to be selectively passed through the desired memory cell MC.

Moreover, when performing access to the memory cell MC, a voltage is applied to the dummy word line DWL, and the dummy transistor DTr is set to an ON state. This makes it possible for an electrical resistance value between the local bit line LBL and the global bit line GBL to be reduced.

Figure 3:
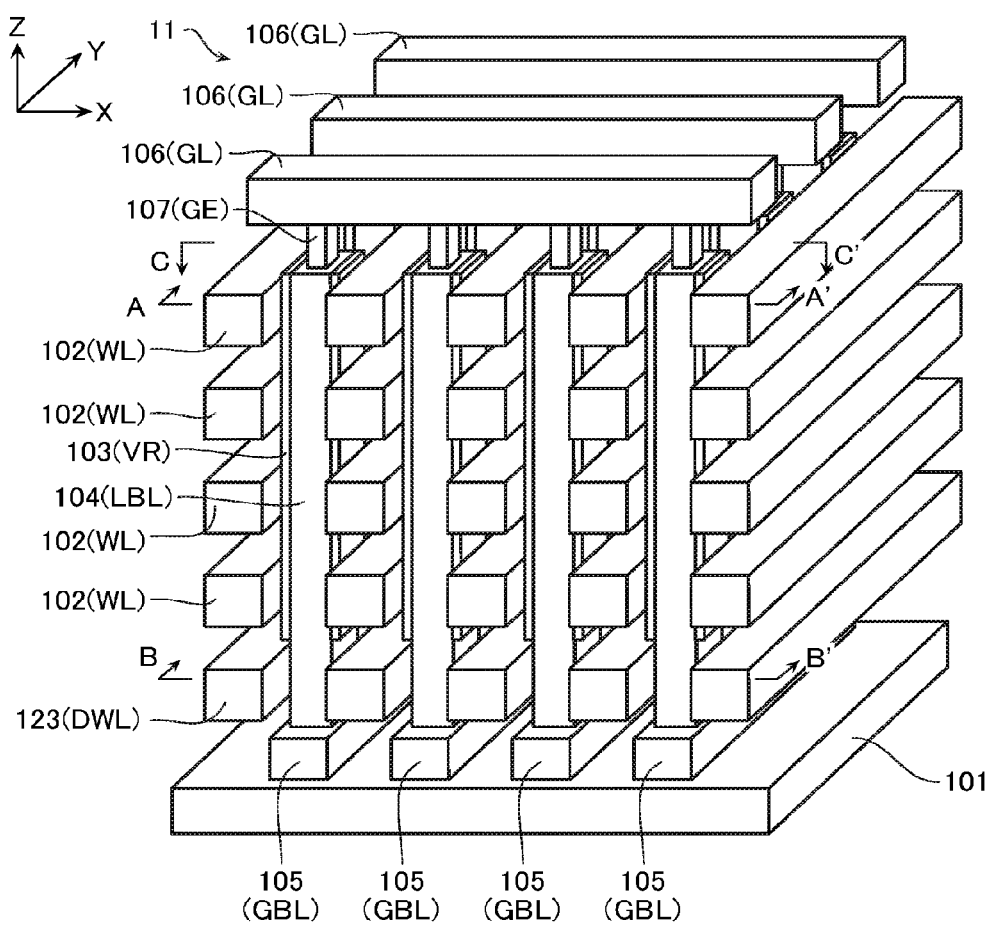
FIG. 3 is a perspective view showing a configuration of part of the same nonvolatile semiconductor memory device.
Figure 4:
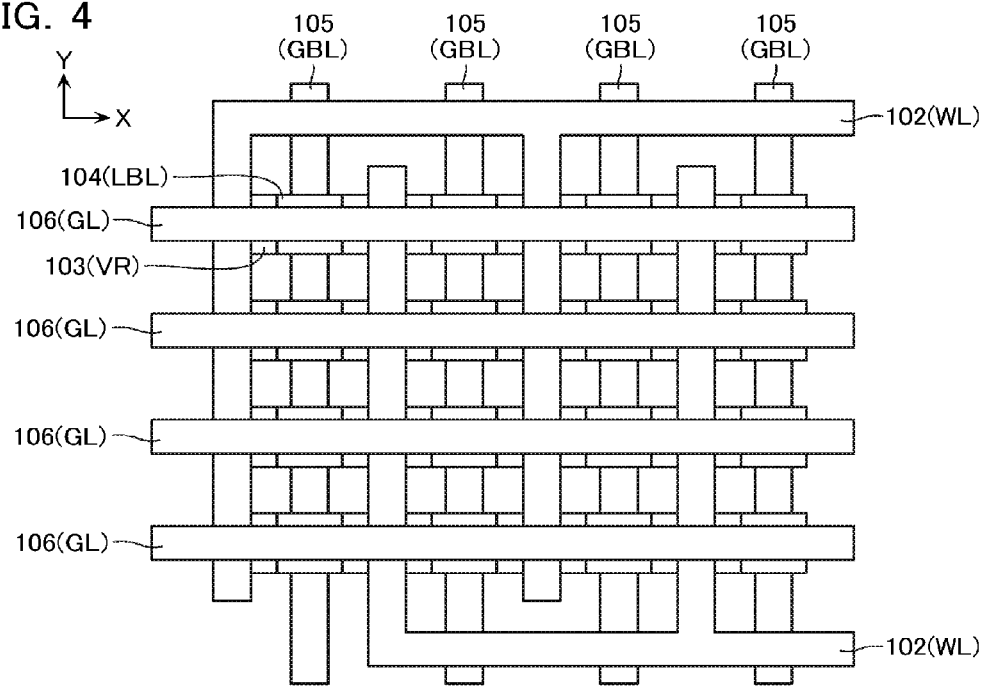
FIG. 4 is a plan view showing a configuration of part of the same nonvolatile semiconductor memory device.
Figure 5:
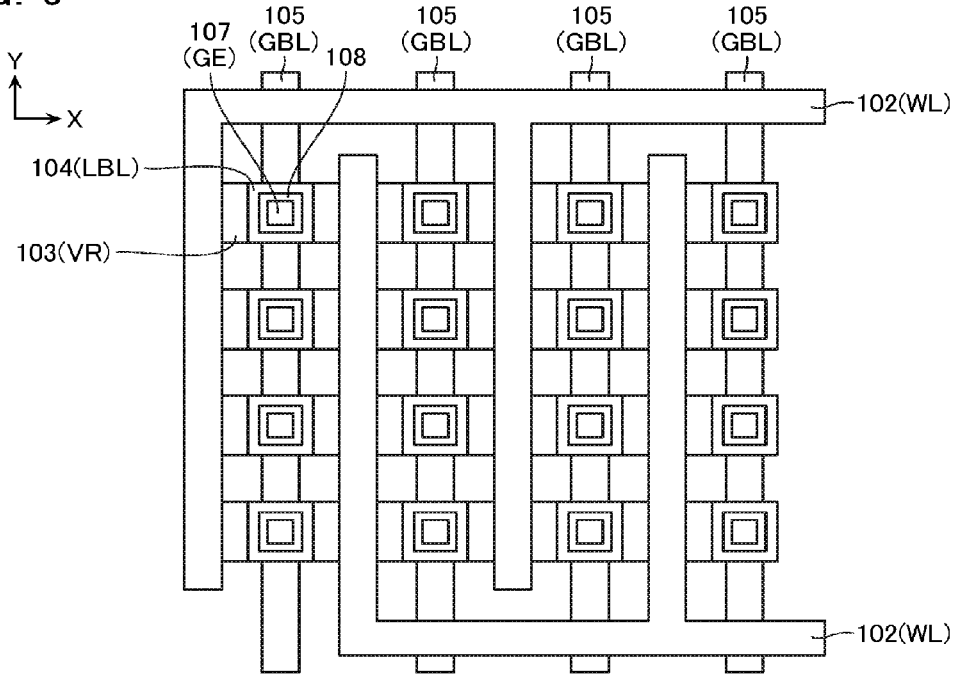
FIG. 5 is a plan view showing a configuration of part of the same nonvolatile semiconductor memory device.
Figure 6:
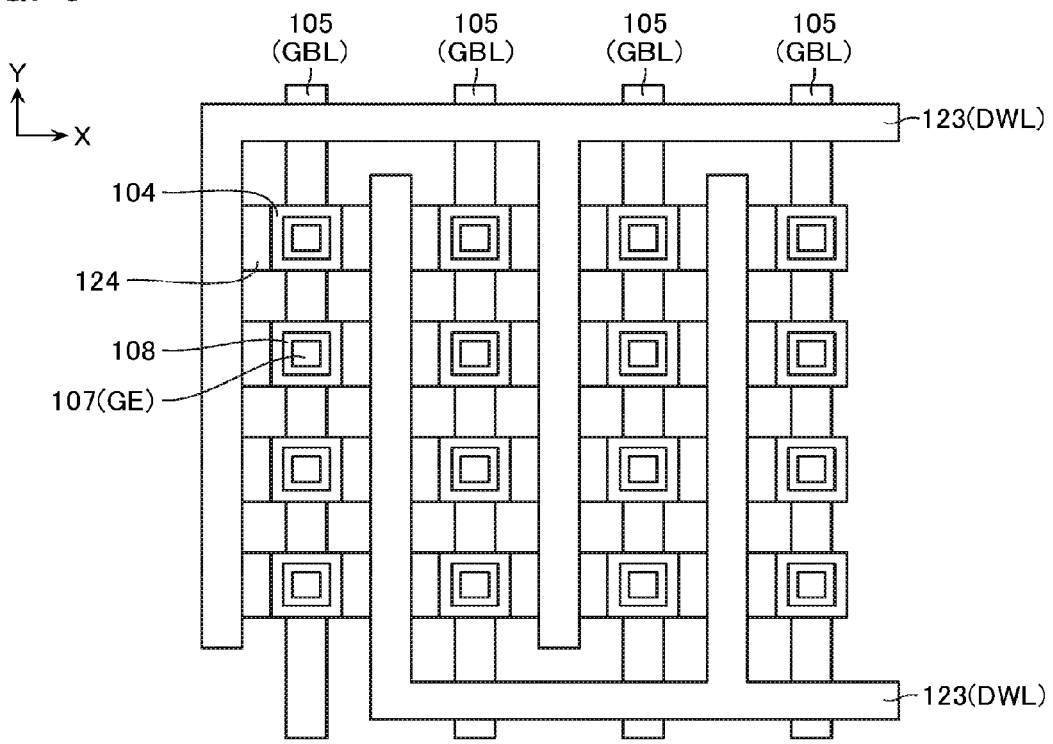
FIG. 6 is a plan view showing a configuration of part of the same nonvolatile semiconductor memory device.

Next, a schematic configuration of the memory cell array 11 according to the first embodiment will be described with reference to FIGS. 3 to 6. FIG. 3 is a schematic perspective view showing a configuration of part of the memory cell array 11. FIG. 4 is a schematic top view of the memory cell array 11 seen from a Z direction. FIG. 5 is a cross-sectional view taken along the line A-A' of FIG. 3. FIG. 6 is a cross-sectional view taken along the line B-B' of FIG. 3. Note that in FIGS. 3 to 6, part of the configuration is omitted. Moreover, the configurations shown in FIGS. 3 to 6 are merely examples, and specific configurations may be appropriately changed.

As shown in FIG. 3, the memory cell array 11 comprises: a plurality of word line conductive layers 102 stacked above a substrate 101 and functioning as the word lines WL; a variable resistance layer 103 contacting side surfaces of these plurality of word line conductive layers 102 and functioning as the plurality of variable resistance elements VR (memory cells MC); a semiconductor layer 104 contacting a side surface of this variable resistance layer 103 and functioning as the local bit line LBL; and a bit line conductive layer 105 connected to a lower end of this semiconductor layer 104 and functioning as the global bit line GBL. In addition, the memory cell array 11 comprises: a gate line conductive layer 106 functioning as the gate line GL (first gate electrode); and a gate electrode layer 107 extending downwardly from a lower surface of this gate line conductive layer 106 and functioning as the gate electrode GE. Moreover, the memory cell array 11 comprises a dummy word line conductive layer 123 positioned downwardly of the plurality of word line conductive layers 102 (between the substrate 101 and the word line conductive layers 102) and functioning as the dummy word line DWL (second gate electrode).

The word line conductive layer 102 is formed from the likes of polysilicon including an n type impurity, for example, and functions as the word line WL. As shown in FIGS. 4 and 5, the word line conductive layer 102 is formed in a comb shape when seen from the Z direction, and faces, from an X direction, via the variable resistance layer 103, to all of the local bit lines LBL.

Note that the word line conductive layer 102 may be formed by, for example, tungsten (W), tungsten nitride (WN), tungsten silicide (WSix), tantalum (Ta), tantalum nitride (TaN), tantalum silicide (TaSix), palladium silicide (PdSix), erbium silicide (ErSix), yttrium silicide (YSix), platinum silicide (PtSix), hafnium silicide (HfSix), nickel silicide (NiSix), cobalt silicide (CoSix), titanium silicide (TiSix), vanadium silicide (VSix), chromium silicide (CrSix), manganese silicide (MnSix), iron silicide (FeSix), ruthenium (Ru), molybdenum (Mo), titanium (Ti), vanadium (V), chromium (Cr), manganese (Mn), iron (Fe), cobalt (Co), nickel (Ni), gold (Au), silver (Ag), or copper (Cu), or a compound of these.

The variable resistance layer 103 is formed from a metal oxide film of the likes of hafnium oxide (HfOx), for example, and functions as the plurality of variable resistance elements VR (memory cells MC). The variable resistance layer 103 is provided between the plurality of word line conductive layers 102 provided in the Z direction and the semiconductor layer 104. Note that a film thickness of the variable resistance layer 103 is about 5 nm, for example, but may be appropriately changed in a range of about 2 to 10 nm.

Note that the variable resistance layer 103 may be formed employing, for example, a transition metal oxide of the likes of chromium (Cr), tungsten (W), vanadium (V), niobium (Nb), tantalum (Ta), titanium (Ti), zirconium (Zr), scandium (Sc), yttrium (Y), thorium (Th), manganese (Mn), iron (Fe), ruthenium (Ru), osmium (Os), cobalt (Co), nickel (Ni), copper (Cu), zinc (Zn), cadmium (Cd), aluminum (Al), gallium (Ga), indium (In), tin (Sn), lead (Pb), and bismuth (Bi), or an oxide of the likes of a so-called rare earth element from lanthanum (La) to lutetium (Lu).

Note that in the example shown in FIG. 3, the variable resistance layer 103 is provided commonly between the plurality of word line conductive layers 102 provided in the Z direction and the semiconductor layer 104, and configures the plurality of variable resistance elements VR adjacent in the Z direction. However, for example, a plurality of variable resistance layers may be provided in the Z direction, and these plurality of variable resistance layers may be respectively provided between the word line conductive layers 102 and the semiconductor layer 104. Note that in this case, these plurality of variable resistance layers may each configure the variable resistance element VR.

The semiconductor layer 104 is formed from, for example, polysilicon to which an impurity has not been added, and functions as the local bit line LBL. A plurality of the semiconductor layers 104, each extending in the Z direction, are provided in a matrix with a certain pitch in the X direction and a Y direction. A film thickness in the X direction of the semiconductor layer 104 may be appropriately changed, but can be set to about 10 nm, for example.

Note that the semiconductor layer 104 may be formed from the likes of polysilicon to which an impurity such as phosphorus (P), boron (B), or arsenic (As), for example, has been added.

The bit line conductive layer 105 is formed from a metal such as tungsten (W), for example, and functions as the global bit line GBL. A plurality of the bit line conductive layers 105, each extending in the Y direction, are provided with a certain pitch in the X direction.

Note that the bit line conductive layer 105 may be formed from, for example, any of materials applicable to the word line conductive layer 102.

The gate line conductive layer 106 is formed from a metal such as tungsten (W), for example, and functions as the gate line GL. As shown in FIG. 4, a plurality of the gate line conductive layers 106, each extending in the X direction along a plurality of the semiconductor layers 104 aligned in the X direction, are provided in the Y direction, along a plurality of the semiconductor layers 104 aligned in the Y direction, with an identical pitch to that of these semiconductor layers 104.

Note that the gate line conductive layer 106 may be formed from, for example, any of materials applicable to the word line conductive layer 102.

The gate electrode layer 107 is formed from the likes of high concentration n+ type polysilicon or titanium nitride (TiN), for example, and functions as the gate electrode GE. As shown in FIG. 5, a plurality of the gate electrode layers 107 are provided in a matrix with a certain pitch in the X direction and the Y direction. Moreover, the gate electrode layer 107 is covered by the semiconductor layer 104 via a gate insulating layer 108, in an XY plane. In addition, as shown in FIG. 3, a plurality of the gate electrodes GE aligned in the X direction are connected at their upper ends to a lower surface of a common gate line conductive layer 106. Note that the gate insulating layer 108 is formed from an insulating layer of the likes of silicon oxide ($SiO_2$), for example.

The dummy word line conductive layer 123 is formed from a material applicable to the word line conductive layer 102 of the likes of polysilicon including an n type impurity, for example, and functions as the dummy word line DWL. As shown in FIG. 6, the dummy word line conductive layer 123 is formed in a comb shape when seen from the Z direction, and faces, from the X direction, to all of the local bit lines LBL.

Figure 7A:
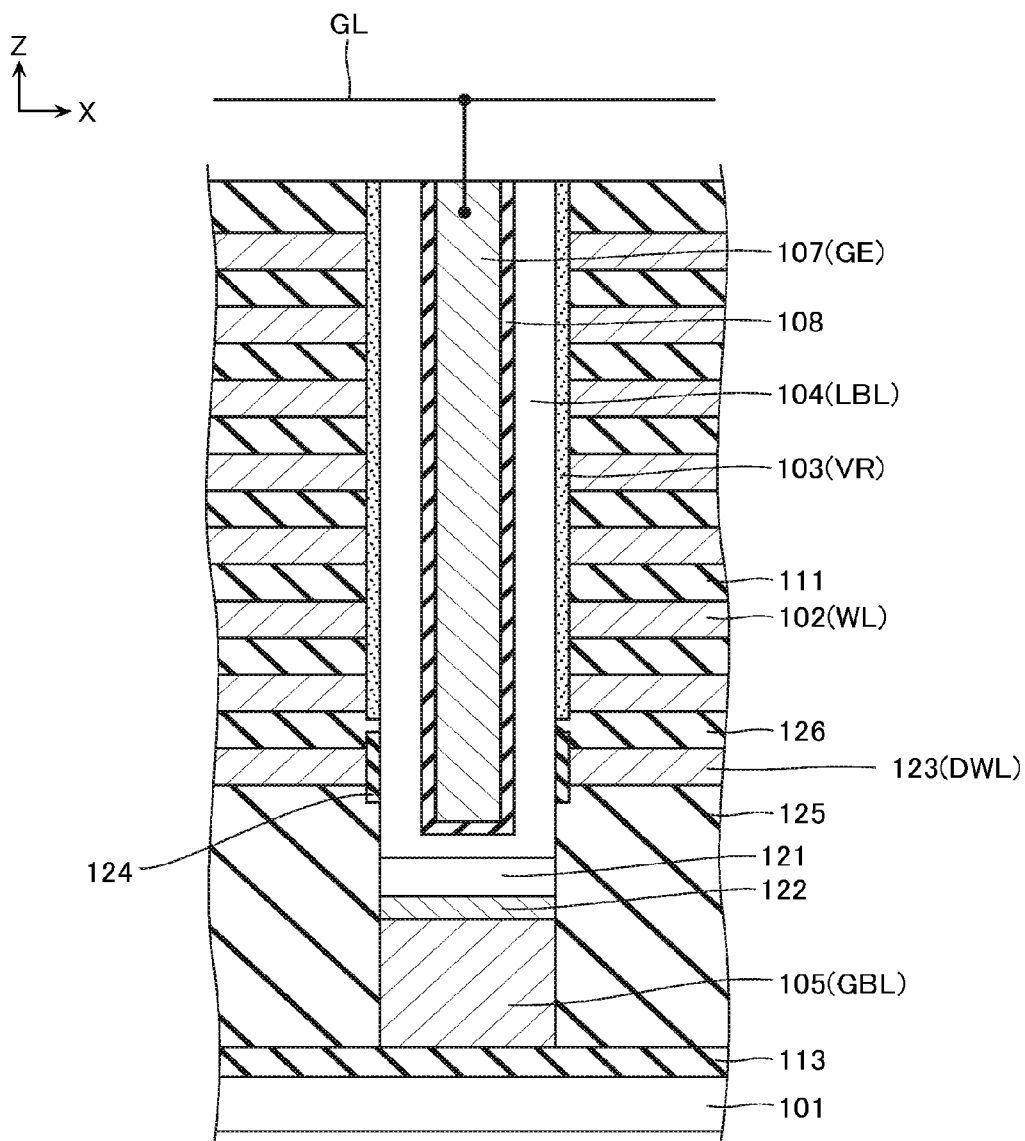
FIG. 7A is a cross-sectional view showing a configuration of part of the same nonvolatile semiconductor memory device.
Figure 7B:
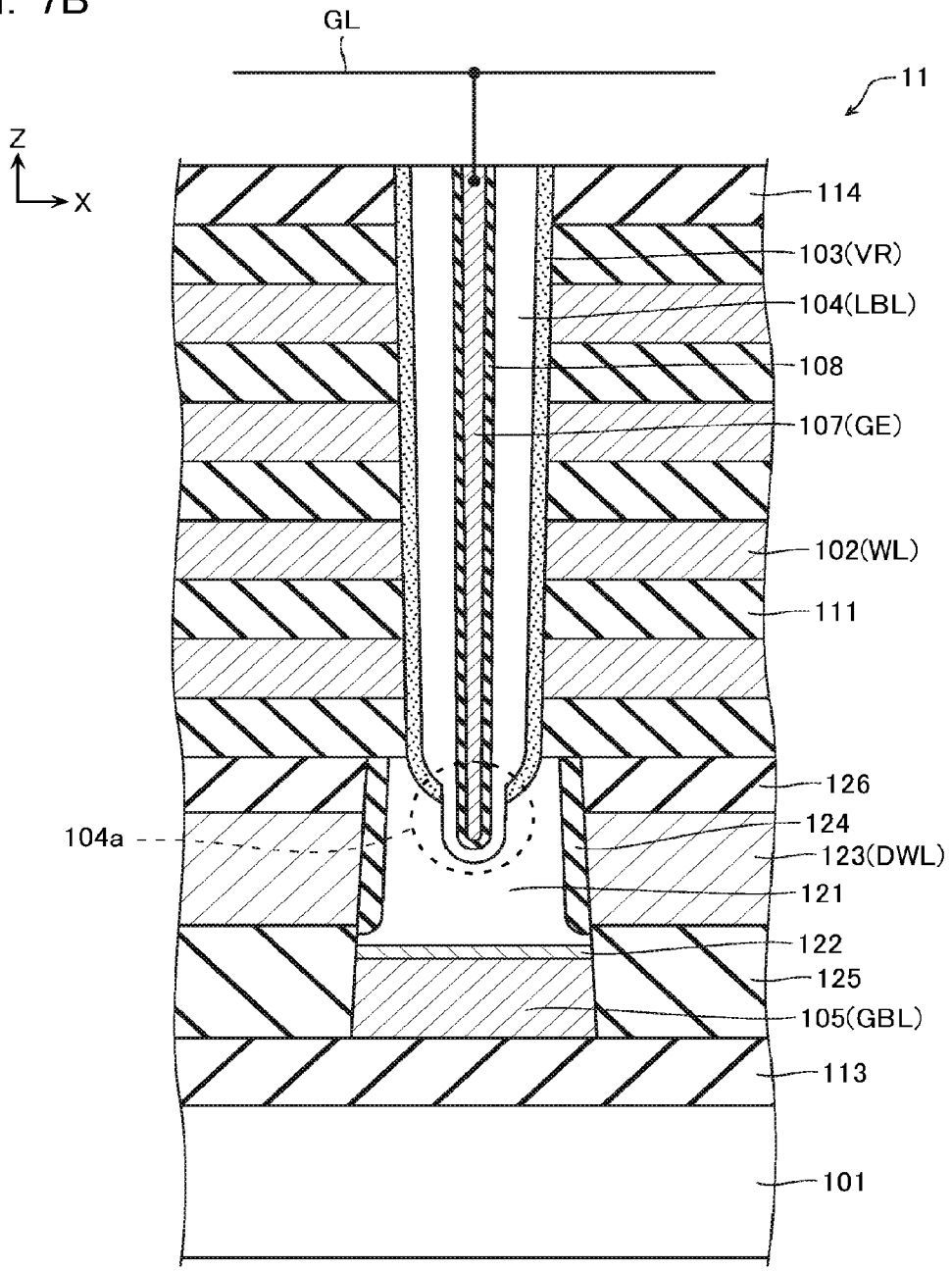
FIG. 7B is a cross-sectional view showing a configuration of part of the same nonvolatile semiconductor memory device.

Next, the memory cell array 11 according to the present embodiment will be described in more detail with reference to FIGS. 7A and 7B. FIG. 7A is a cross-sectional view showing a configuration of part of the memory cell array 11, and is a cross-sectional view taken along the line C-C' of FIG. 3. FIG. 7B is a cross-sectional view showing a configuration example of the same memory cell array 11.

As shown in FIG. 7A, the memory cell array 11 comprises: the plurality of word line conductive layers 102 (word lines WL) stacked above the substrate 101 via interlayer insulating layers 111; the variable resistance layer 103 (variable resistance element VR) contacting the side surfaces of these plurality of word line conductive layers 102;

the semiconductor layer 104 (local bit line LBL) contacting the side surface of this variable resistance layer 103 and extending in the Z direction; and the gate electrode layer 107 (gate electrode GE) facing this semiconductor layer 104 via the gate insulating layer 108 and extending in the Z direction. In addition, as shown in FIG. 7A, the bit line conductive layer 105 (global bit line GBL) is connected, via a semiconductor layer 121 and a barrier metal layer 122, to a lower end (one end) of the semiconductor layer 104.

The word line conductive layer 102 is formed from the likes of polysilicon including an n type impurity, for example. The inter-layer insulating layer 111 is formed from an insulating layer of the likes of silicon oxide ($SiO_2$), for example, and is provided between the word line conductive layers 102 adjacent in the Z direction. The variable resistance layer 103 is formed from a metal oxide film of the likes of hafnium oxide (HfOx), for example. The semiconductor layer 104 is formed from the likes of polysilicon to which an impurity has not been added, for example. The gate insulating layer 108 is formed from an insulating layer of the likes of silicon oxide ($SiO_2$), for example. The gate electrode layer 107 is formed from the likes of high concentration n+ type polysilicon or titanium nitride (TiN), for example. The semiconductor layer 121 is formed from high concentration n+type polysilicon, for example, and reduces a contact resistance between the semiconductor layer 104 and the bit line conductive layer 105. An impurity concentration in the semiconductor layer 121 is at least higher than an impurity concentration in the semiconductor layer 104. The barrier metal layer 122 is formed from the likes of titanium nitride (TiN), for example, and prevents a chemical reaction or diffusion of atoms, and so on, that may occur during a manufacturing step. The bit line conductive layer 105 is formed from a metal such as tungsten (W), for example.

Now, as shown in FIG. 7A, in the present embodiment, the dummy word line conductive layer 123 is provided downwardly of the word line conductive layer 102. The dummy word line conductive layer 123 is formed from a material appliable to the word line conductive layer 102 of the likes of polysilicon including an n type impurity, for example. Moreover, the dummy word line conductive layer 123 faces the side surface of the semiconductor layer 104 via a dummy gate insulating layer 124. The dummy gate insulating layer 124 is formed from an insulating layer of the likes of silicon oxide ($SiO_2$), for example. Note that the dummy gate insulating layer 124 is at least formed from a material different from that of the variable resistance layer 103. In addition, insulating layers 125 and 126 configured from the likes of silicon oxide ($SiO_2$) are formed upwardly and downwardly of the dummy word line conductive layer 123.

Now, as explained with reference to FIG. 2, during access to the memory cell MC, in order to lower the resistance value between the bit line conductive layer 105 (global bit line GBL) and the semiconductor layer 104 (local bit line LBL), a voltage can be applied to the dummy word line conductive layer 123. However, sometimes, in a case such as when, for example, an insulating layer between the dummy word line conductive layer 123 and the semiconductor layer 104 is part of the variable resistance layer 103, this part of the variable resistance layer 103 ends up becoming low resistance and a leak current ends up occurring between the bit line conductive layer 105 and the dummy word line conductive layer 123.

In contrast, in the present embodiment, in addition to the variable resistance layer 103, the dummy gate insulating layer 124 is provided between the semiconductor layer 104 and the dummy word line conductive layer 123. Therefore, even if a rather large voltage is applied between the dummy word line conductive layer 123 and the semiconductor layer 121, it does not occur that the insulating layer becomes low resistance as mentioned above. Therefore, it is possible to lower the resistance value between the bit line conductive layer 105 and the semiconductor layer 104 while suppressing occurrence of a leak current.

Note that as shown in FIG. 7A, in the present embodiment, the dummy word line conductive layer 123 faces the gate electrode layer 107 via the dummy gate insulating layer 124, the semiconductor layer 104, and the gate insulating layer 108;

and the semiconductor layer 104 is faced, from the X direction, not only by the dummy word line conductive layer 123 but also by the gate electrode layer 107. Therefore, during access to the memory cell MC (when the dummy transistor DTr (FIG. 2) is set to ON state), by controlling a voltage of the gate electrode layer 107 as well as the dummy word line conductive layer 123, the resistance value in a lower end portion of the semiconductor layer 104 can be even more suitably reduced. Additionally, when the dummy transistor DTr (FIG. 2) is set to OFF state, the voltages of the gate electrode layer 107 and the dummy word line conductive layer 123 are lowered. Therefore, a leak current of the dummy transistor DTr in the OFF state can be lowered. In particular, in the present embodiment, a lower end of the gate electrode layer 107 is positioned more downwardly than an upper surface of the dummy word line conductive layer 123 (one end in the Z direction of the gate electrode layer 107 is positioned between one end (for example, a lower end) and another end on an opposite side (for example, an upper end), of the dummy word line conductive layer 123), and the resistance value in the lower end portion of the semiconductor layer 104 can be even more suitably controlled.

In addition, as explained with reference to FIG. 6, the dummy word line conductive layer 123 according to the present embodiment is formed in a comb shape when seen from the Z direction, similarly to the word line conductive layer 102. Therefore, the number of contacts connecting the dummy word line conductive layer 123 and the row decoder 13 (FIG. 1) can be more reduced compared to a case such as when, for example, the dummy word line conductive layer 123 is formed linearly extending in the Y direction, and a plurality of these are provided in the X direction.

Note that as shown in FIG. 7B, for example, a lower end portion 104a (one end portion) of the semiconductor layer 104 may be positioned more downwardly than an upper surface of the semiconductor layer 121 including an n type impurity. Moreover, the semiconductor layer 121 may cover a side surface in the X direction and lower surface of the lower end portion 104a of the semiconductor layer 104. As a result, as explained with reference to, for example, FIG. 7A, a contact area of the semiconductor layer 104 and the semiconductor layer 121 can be more increased and the resistance value between the bit line conductive layer 105 and the semiconductor layer 104 can be further reduced compared to when the semiconductor layer 121 contacts only the lower end of the semiconductor layer 104. Note that in this case, the dummy gate insulating layer 124 may be provided on a side surface of the semiconductor layer 121. Furthermore, the dummy word line conductive layer 123 may face the side surface of the semiconductor layer 121 via this dummy gate insulating layer 124.

Method of Manufacturing according to First Embodiment

Next, a method of manufacturing the semiconductor memory device according to the present embodiment will be described with reference to FIGS. 8 to 18. FIGS. 8 to 18 are perspective views for explaining the same method.

Figure 8:
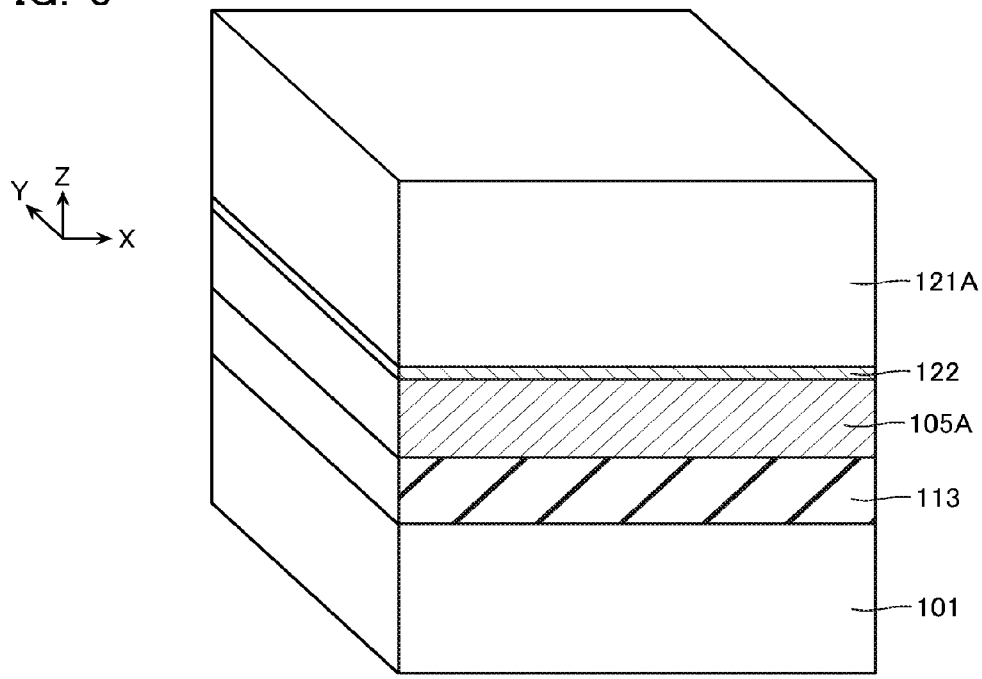
FIGS. 8 to 18 are perspective views for explaining a method of manufacturing the same nonvolatile semiconductor memory device.

As shown in FIG. 8, in the same method of manufacturing, a conductive layer 105A which will form the bit line conductive layer 105, the barrier metal layer 122, and a semiconductor layer 121A which will form the semiconductor layer 121, are deposited on an insulating layer 113 of the substrate 101. The conductive layer 105A is formed from a metal such as tungsten (W), for example. The barrier metal layer 122 is formed from the likes of titanium nitride (TiN), for example, and prevents a chemical reaction or diffusion of atoms, and so on, that may occur during a manufacturing step. The semiconductor layer 121A is formed from high concentration n+ type polysilicon, for example. Deposition of these layers is performed by a means such as CVD (Chemical Vapor Deposition), for example.

Figure 9:
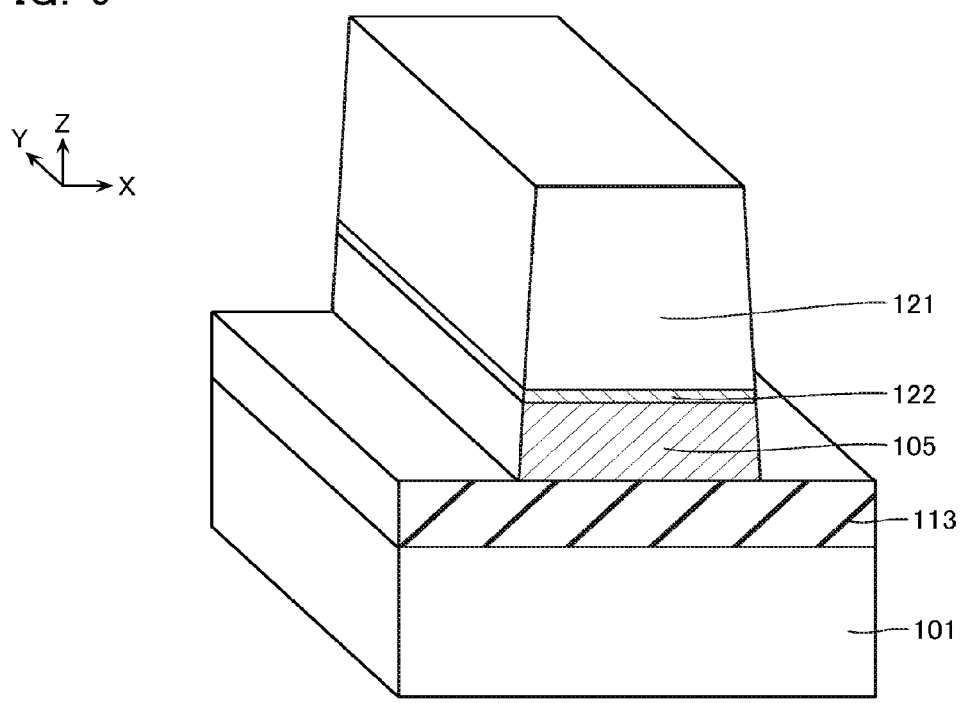

Next, as shown in FIG. 9, the conductive layer 105A, the barrier metal layer 122, and the semiconductor layer 121A are divided in the X direction to form the bit line conductive layer 105 and the semiconductor layer 121. This step is performed by a means such as RIE (Reactive Ion Etching), for example.

Figure 10:
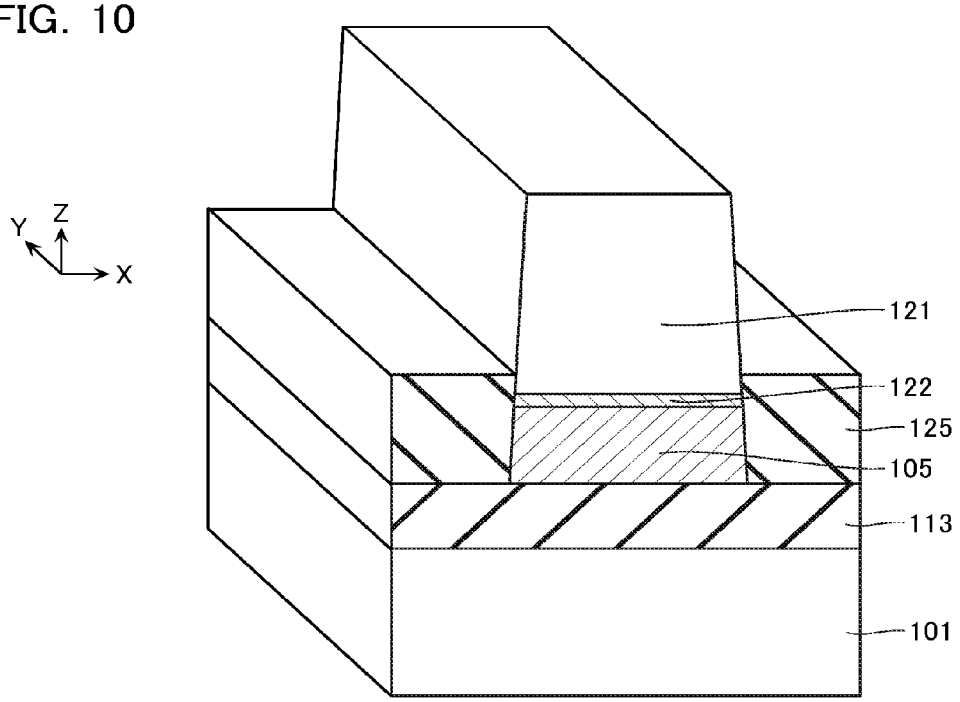

Next, as shown in FIG. 10, the inter-layer insulating layer 125 is formed on a side in the X direction of the bit line conductive layer 105. The inter-layer insulating layer 125 is formed from an insulating layer of the likes of silicon oxide (SiO$_2$), for example. The inter-layer insulating layer 125 is formed by, for example, implanting an insulating layer of the likes of silicon oxide (SiO$_2$) on the side in the X direction of the bit line conductive layer 105 by a means such as CVD, and removing part of the implanted insulating layer by a means such as etchback. Note that an upper surface of the inter-layer insulating layer 125 is formed at a position higher than an upper surface of the barrier metal layer 122 and lower than an upper surface of the semiconductor layer 121.

Figure 11:
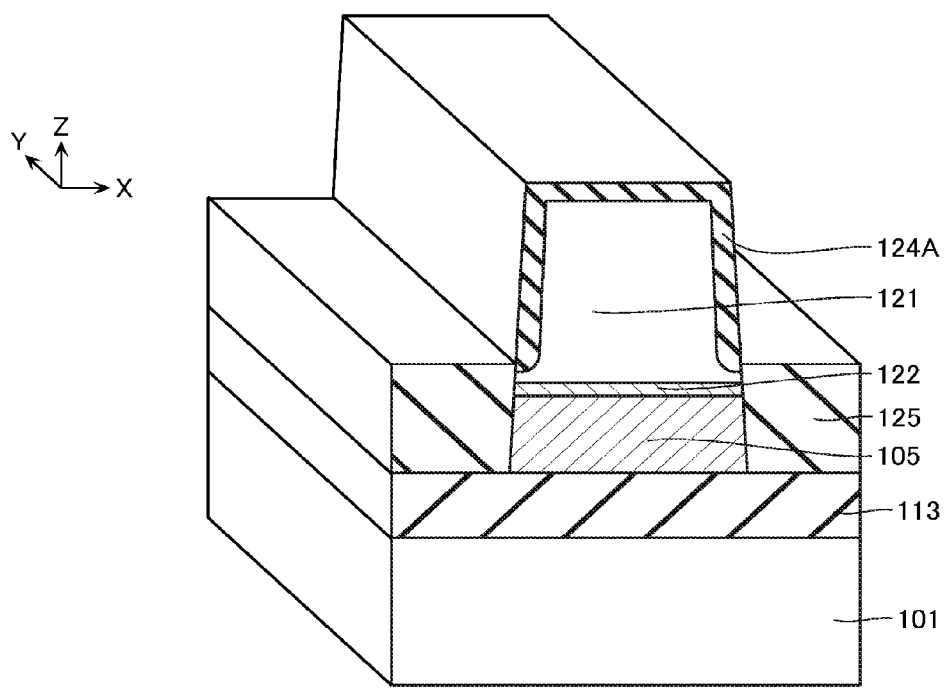

Next, as shown in FIG. 11, an insulating layer 124A which will be the dummy gate insulating layer 124, is formed. The insulating layer 124A may be formed by performing oxidation treatment and oxidizing an upper surface in the Z direction and side surface in the X direction of the semiconductor layer 121. Such a case results in the insulating layer 124A being formed from silicon oxide (SiO$_2$). Note that the insulating layer 124A may also be formed by deposition, for example.

Figure 12:
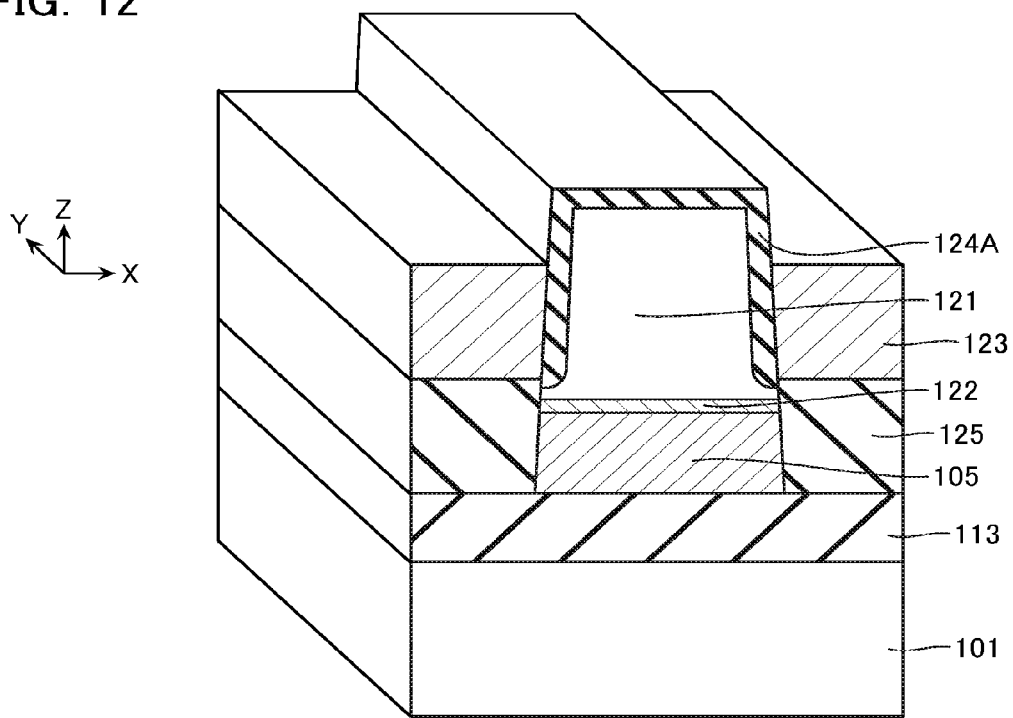

Next, as shown in FIG. 12, the dummy word line conductive layer 123 is formed on the inter-layer insulating layer 125. The dummy word line conductive layer 123 is formed from the likes of polysilicon including an n type impurity, for example. The dummy word line conductive layer 123 is formed by, for example, depositing amorphous silicon including an n type impurity, so as to cover the inter-layer insulating layer 125 and the insulating layer 124A, by a means such as CVD, removing part of the implanted amorphous silicon by a means such as etchback, and form polysilicon from the amorphous silicon by the likes of annealing treatment. Note that an upper surface of the dummy word line conductive layer 123 is formed at a position lower than the upper surface of the semiconductor layer 121.

Figure 13:
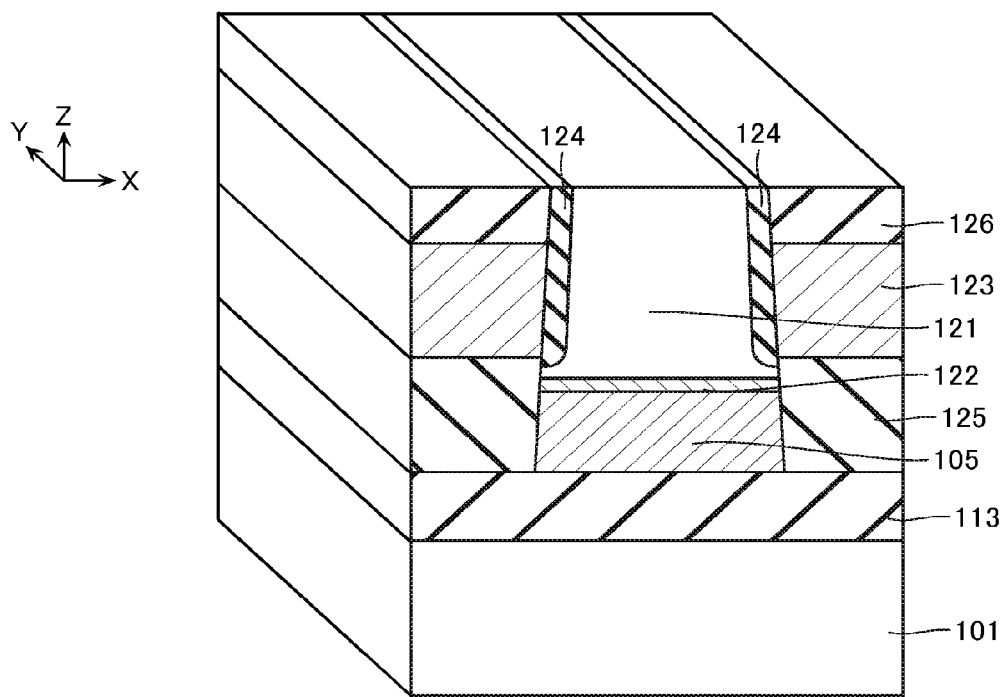

Next, as shown in FIG. 13, the inter-layer insulating layer 126 is formed on the dummy word line conductive layer 123. The inter-layer insulating layer 126 is formed from an insulating layer of the likes of silicon oxide (SiO$_2$), for example. The inter-layer insulating layer 126 is formed by, for example, depositing an insulating layer of the likes of silicon oxide (SiO$_2$), so as to cover the dummy word line conductive layer 123 and the insulating layer 124A, by a means such as CVD, and removing part of the implanted insulating layer by a means such as etchback. Moreover, subsequently, parts of the inter-layer insulating layer 126, the insulating layer 124A, and the semiconductor layer 121 are removed by a means such as planarization to form the dummy gate insulating layer 124 and expose the upper surface of the semiconductor layer 121.

Figure 14:
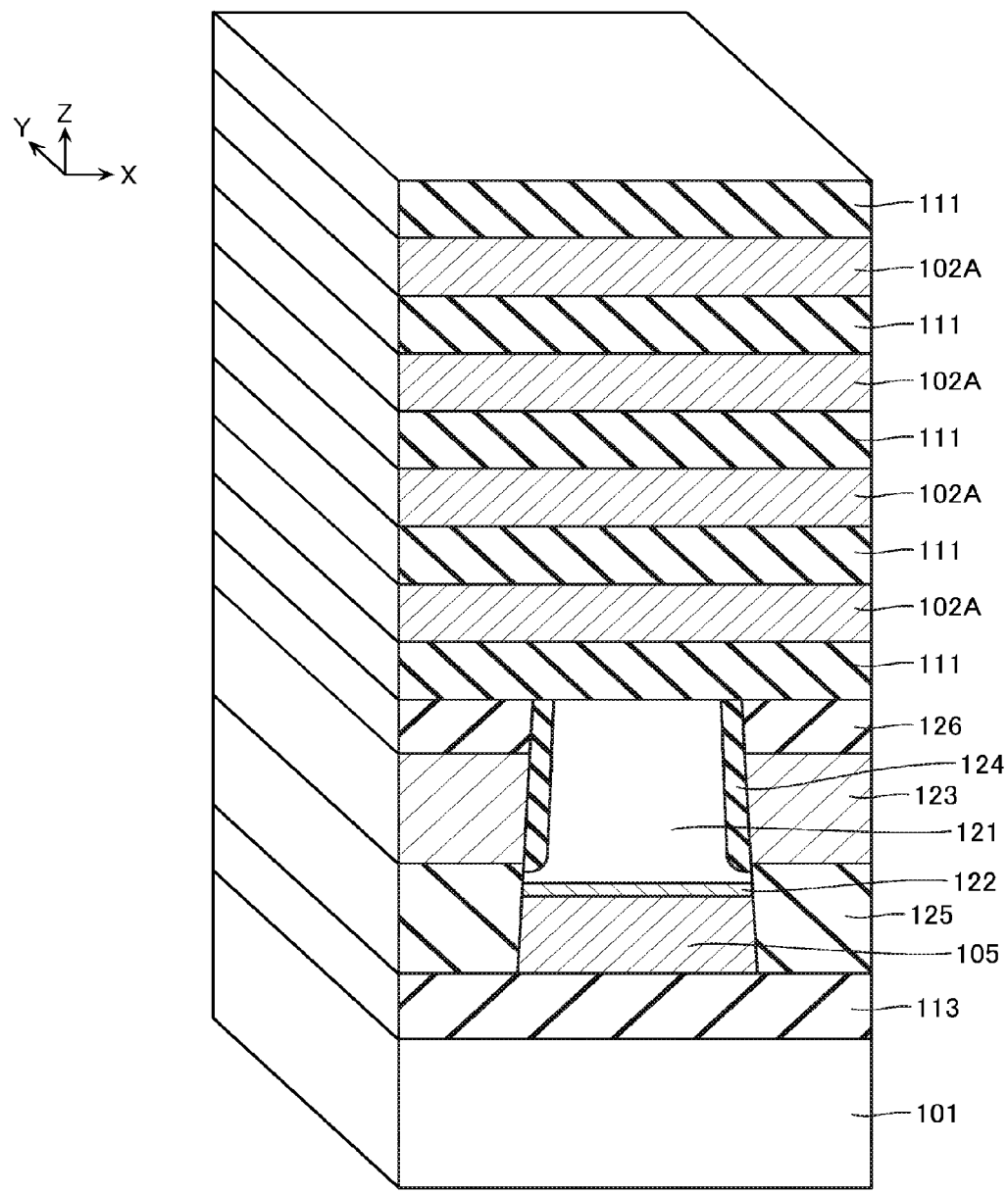

Next, as shown in FIG. 14, a conductive layer 102A which will be the word line conductive layer 102, and the inter-layer insulating layer 111, are alternately deposited above the semiconductor layer 121 and the inter-layer insulating layer 126. The conductive layer 102A is formed from the likes of polysilicon including an n type impurity, for example. The inter-layer insulating layer 111 is formed from an insulating layer of the likes of silicon oxide (SiO$_2$), for example. Deposition of these layers is performed by a means such as CVD, for example.

Figure 15:
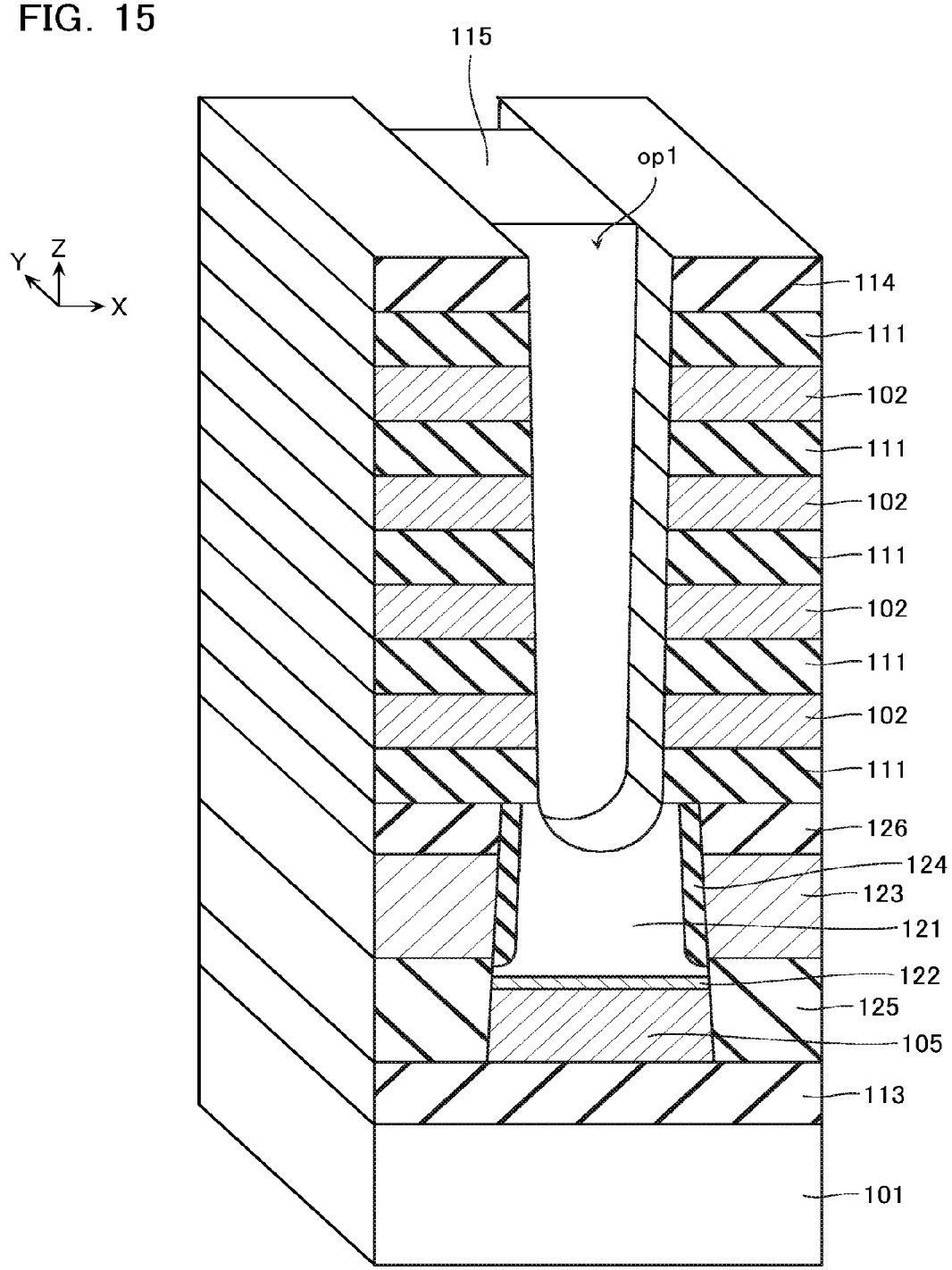

Next, as shown in FIG. 15, the conductive layer 102A and the inter-layer insulating layer 111 are divided in the X direction, and an opening op1 is formed and the word line conductive layer 102 is formed. For example, an insulating layer 114 having a trench provided in a portion thereof corresponding to the opening op1, is formed on the highest layer-positioned inter-layer insulating layer 111, and RIE, or the like, is performed using this insulating layer 114 as a mask. In addition, as shown in FIG. 15, an insulating layer 115 partitioning the opening op1 in the Y direction, is formed. The insulating layer 115 is formed from an insulating layer of the likes of silicon oxide (SiO$_2$), for example. The insulating layer 115 is formed by deposition by CVD, or the like, and processing by RIE, or the like.

Figure 16:
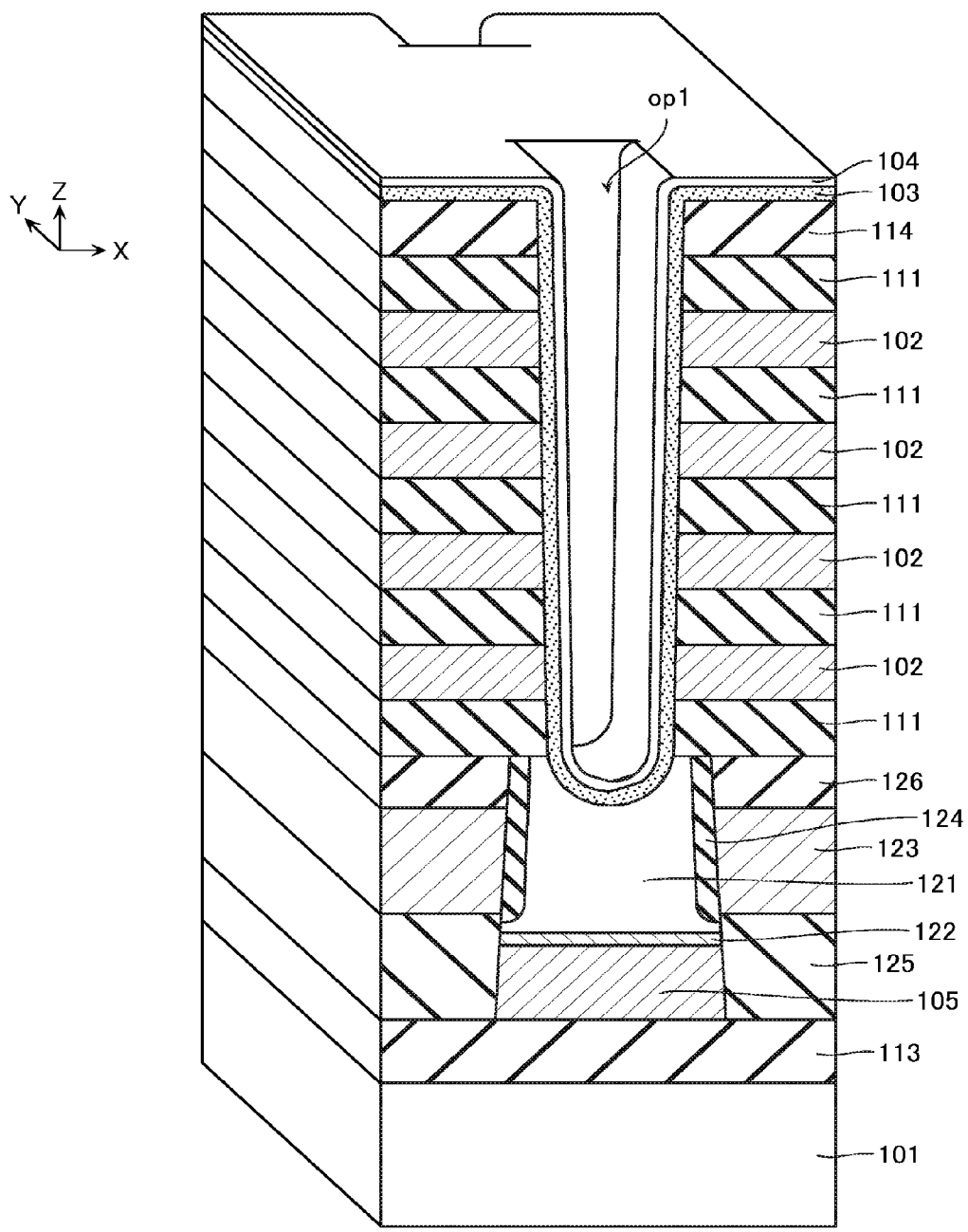

Next, as shown in FIG. 16, the variable resistance layer 103 and part of the semiconductor layer 104 are deposited on a bottom surface and sidewall of the opening op1 and an upper surface of the insulating layer 114. The variable resistance layer 103 is formed from a metal oxide film of the likes of hafnium oxide (HfOx), for example. The semiconductor layer 104 is formed from the likes of polysilicon, for example. Deposition of these layers is performed by a means such as CVD, for example.

Figure 17:
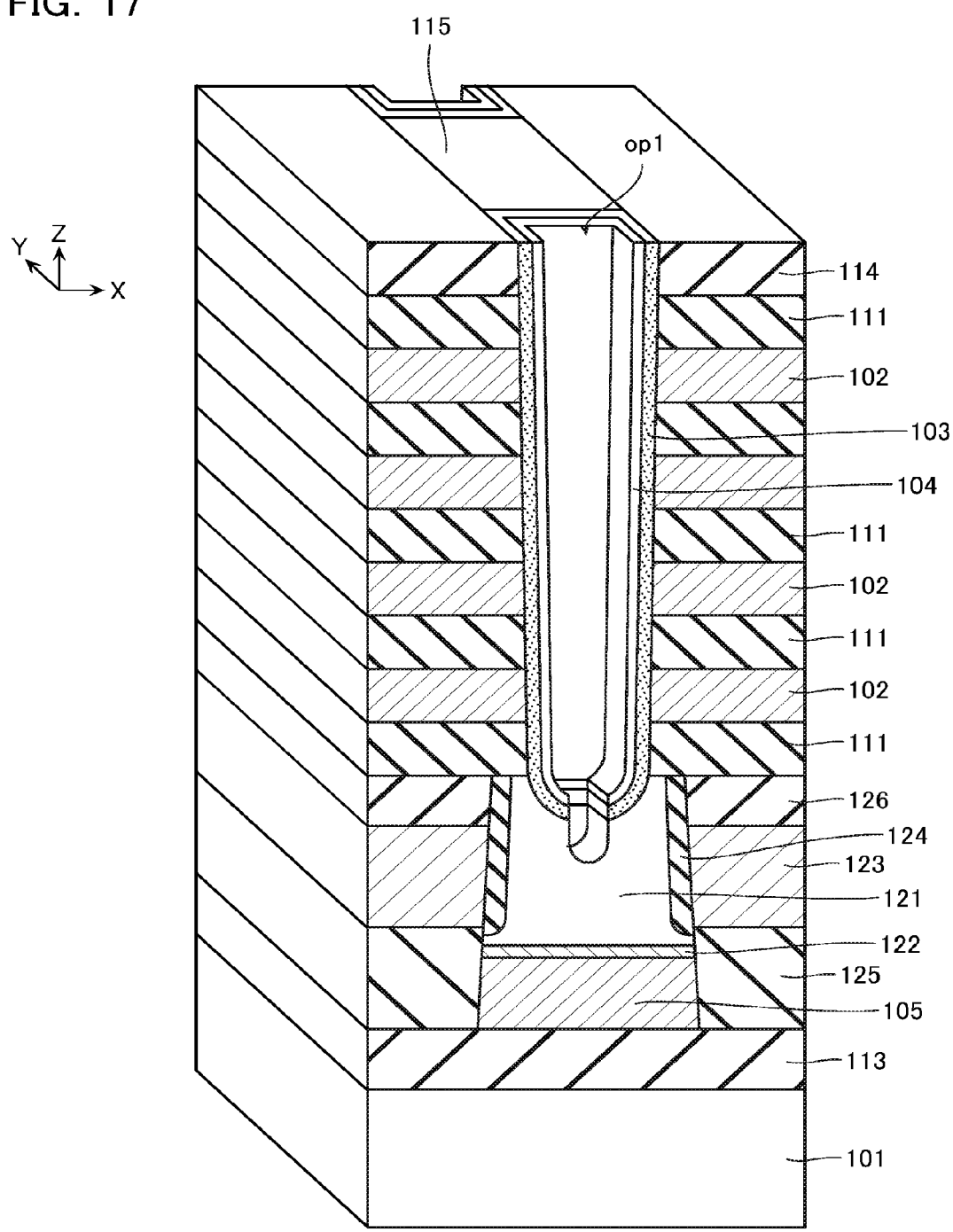

Next, as shown in FIG. 17, portions positioned at a bottom portion of the opening op1 and portions positioned at an upper surface of the insulating layer 114, of the variable resistance layer 103 and the semiconductor layer 104, are removed to expose the semiconductor layer 121 at the bottom surface of the opening op1. Removal of the variable resistance layer 103 and the semiconductor layer 104 is performed by a means such as RIE, for example.

Figure 18:
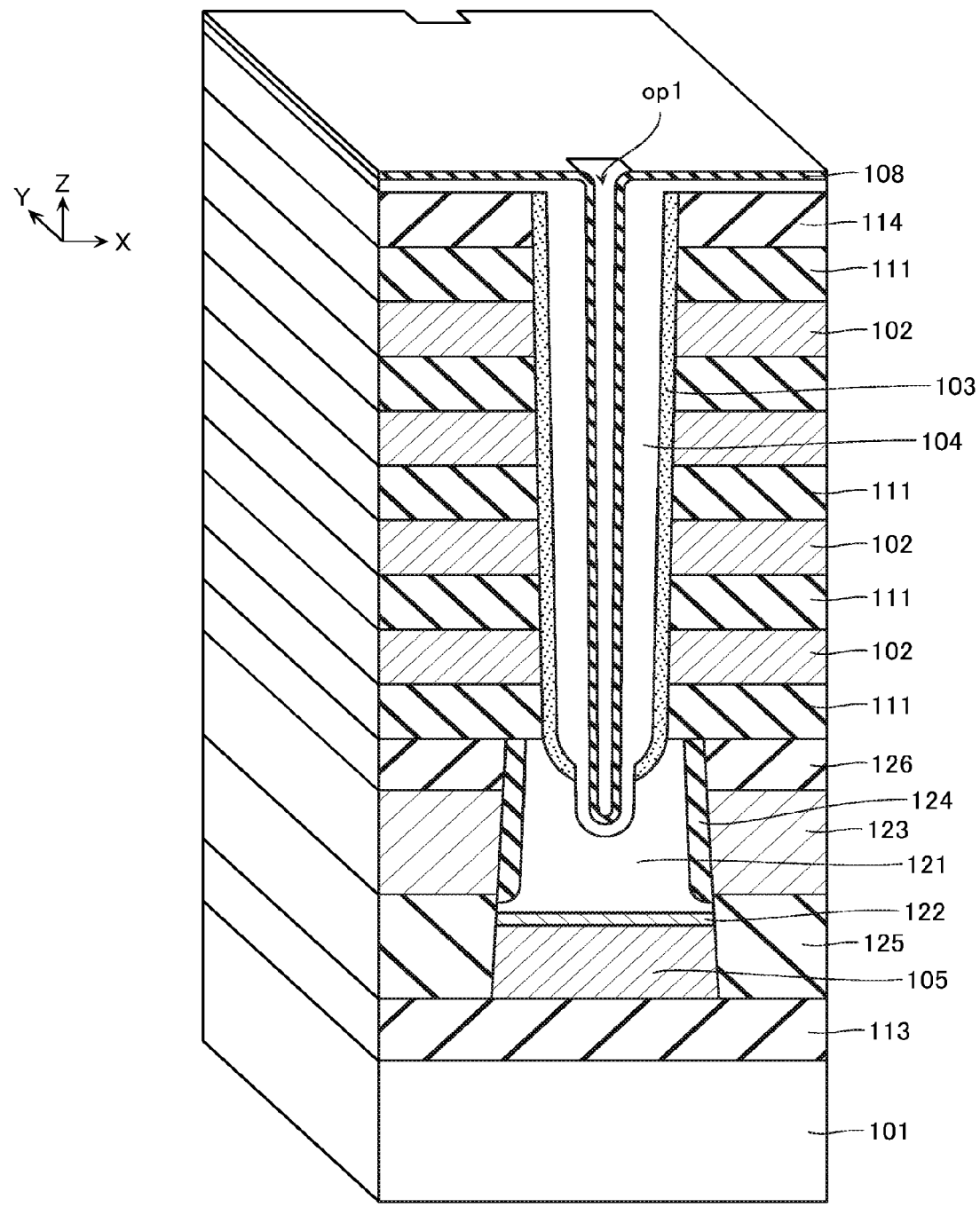

Next, as shown in FIG. 18, the semiconductor layer 104 is further deposited and the gate insulating layer 108 is deposited, on the bottom surface and sidewall of the opening op1 and the upper surface of the insulating layer 114. The gate insulating layer 108 is formed from an insulating layer of the likes of silicon oxide (SiO$_2$), for example. Deposition of these layers is performed by a means such as CVD, for example.

Next, as shown in FIG. 7B, the gate electrode layer 107 is implanted on the inside of the opening op1. The gate electrode layer 107 is formed from the likes of high concentration n+ type polysilicon or titanium nitride (TiN), for example. As a result, the memory cell array 11 described with reference to FIG. 7B is manufactured.

Semiconductor Memory Device according to Second Embodiment

Figure 19:
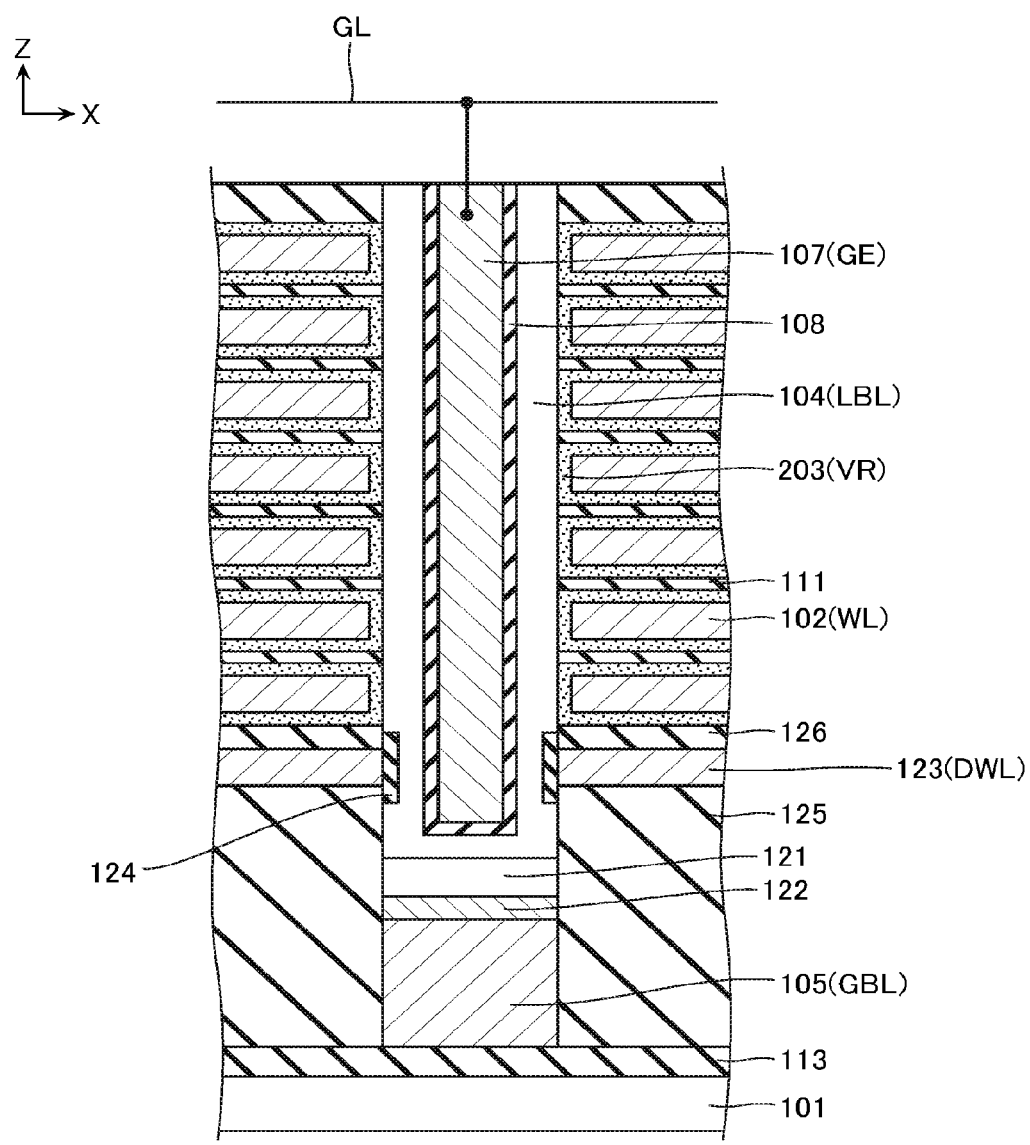
FIG. 19 is a cross-sectional view showing a configuration of part of a nonvolatile semiconductor memory device according to a second embodiment.

Next, a semiconductor memory device according to a second embodiment will be described with reference to FIG. 19. FIG. 19 is a cross-sectional view showing a configuration of part of a memory cell array of the semiconductor memory device according to the present embodiment. Note that in the description below, portions similar to those of the first embodiment will be assigned with identical reference symbols to those assigned in the first embodiment, and descriptions thereof will be omitted.

As shown in FIG. 19, the memory cell array according to the present embodiment is basically configured similarly to the memory cell array 11 according to the first embodiment, but differs in the following point. That is, in the first embodiment, as explained with reference to FIG. 7A, the variable resistance layer 103 was provided between the plurality of word line conductive layers 102 provided in the Z direction and the semiconductor layer 104, and functioned as the plurality of variable resistance elements VR (memory cells MC) adjacent in the Z direction. In contrast, as shown in FIG. 19, in the present embodiment, a plurality of variable resistance layers 203 respectively cover side surfaces, upper surfaces, and lower surfaces of the plurality of word line conductive layers 102, and each functions as the variable resistance element VR (memory cell MC).

Note that in other respects, the variable resistance layer 203 according to the present embodiment is configured similarly to the variable resistance layer 103 according to the first embodiment.

Figure 20:
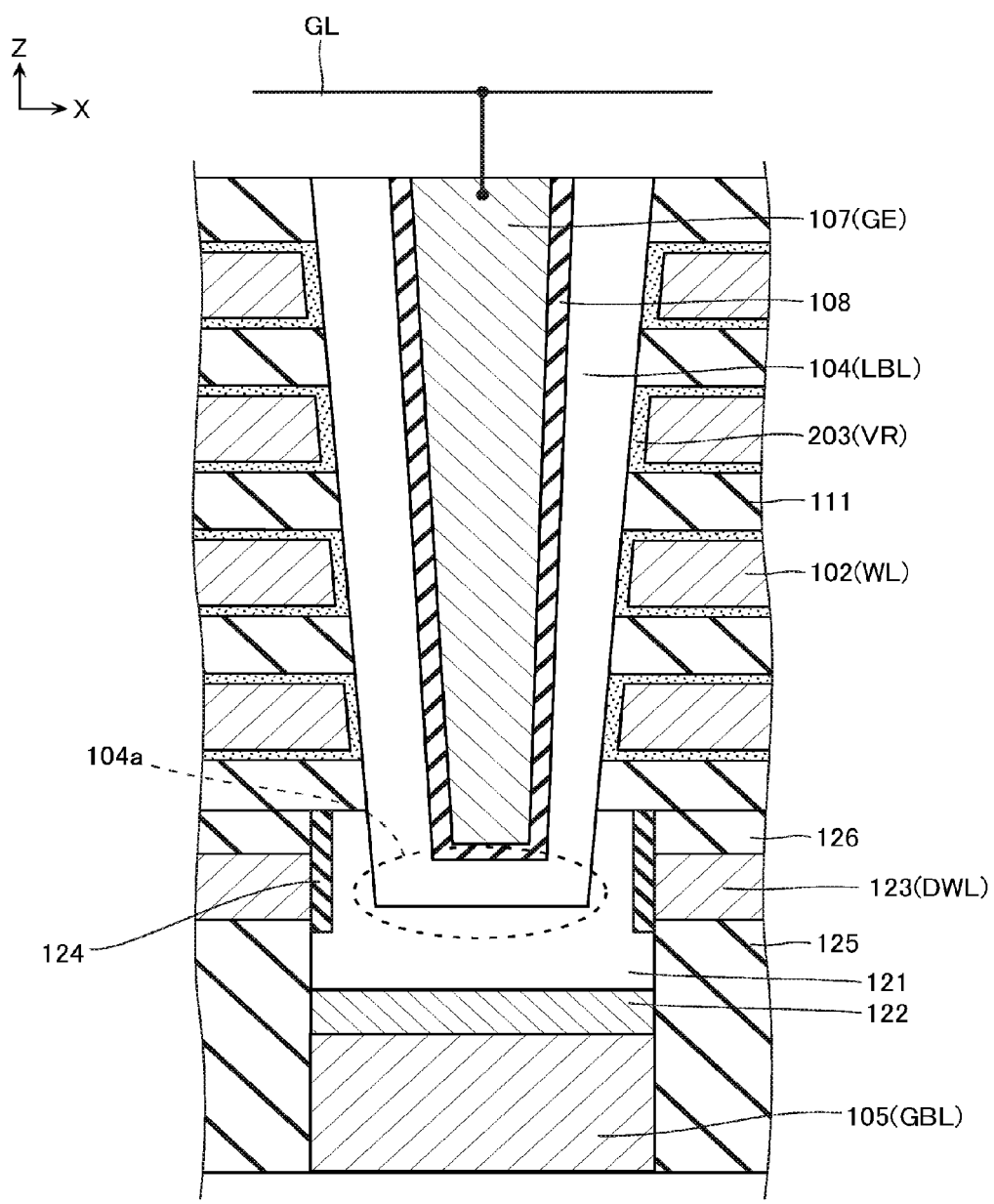
FIG. 20 is a cross-sectional view showing a configuration of part of the same nonvolatile semiconductor memory device.

Note that as shown in FIG. 20, for example, the lower end portion 104a of the semiconductor layer 104 may be positioned more downwardly than the upper surface of the semiconductor layer 121 including an n type impurity. Moreover, the semiconductor layer 121 may cover a side surface in the X direction and lower surface of the lower end portion 104a of the semiconductor layer 104. In this case, the dummy gate insulating layer 124 may be provided on the side surface of the semiconductor layer 121. Furthermore, the dummy word line conductive layer 123 may face the side surface of the semiconductor layer 121 via this dummy gate insulating layer 124.

Method of Manufacturing according to Second Embodiment

Next, a method of manufacturing the semiconductor memory device according to the present embodiment will be described with reference to FIGS. 21 to 25. FIGS. 21 to 25 are cross-sectional views for explaining the same method.

Figure 21:
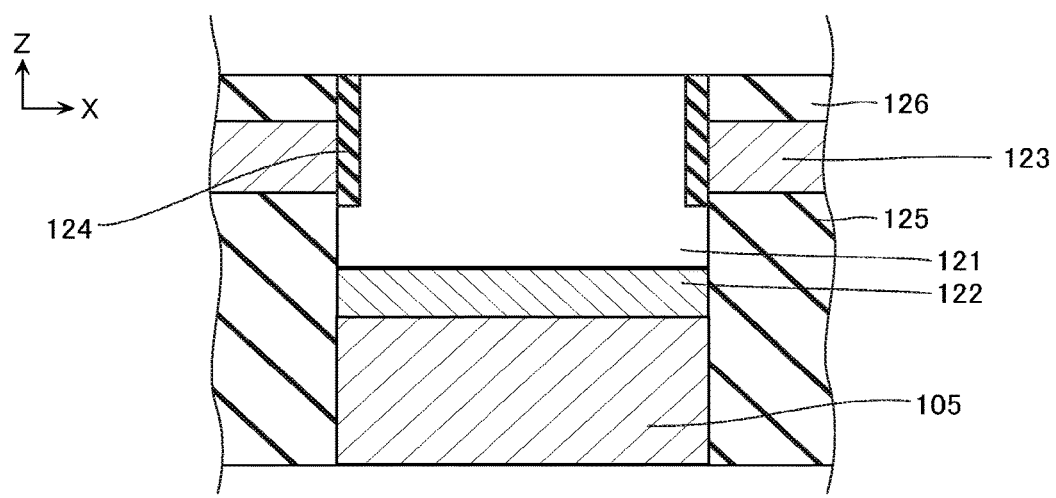
FIGS. 21 to 25 are cross-sectional views for explaining a method of manufacturing the same nonvolatile semiconductor memory device.

In the method of manufacturing according to the present embodiment, as shown in FIG. 21, steps similar to the steps described with reference to FIGS. 8 to 13, are performed.

Figure 22:
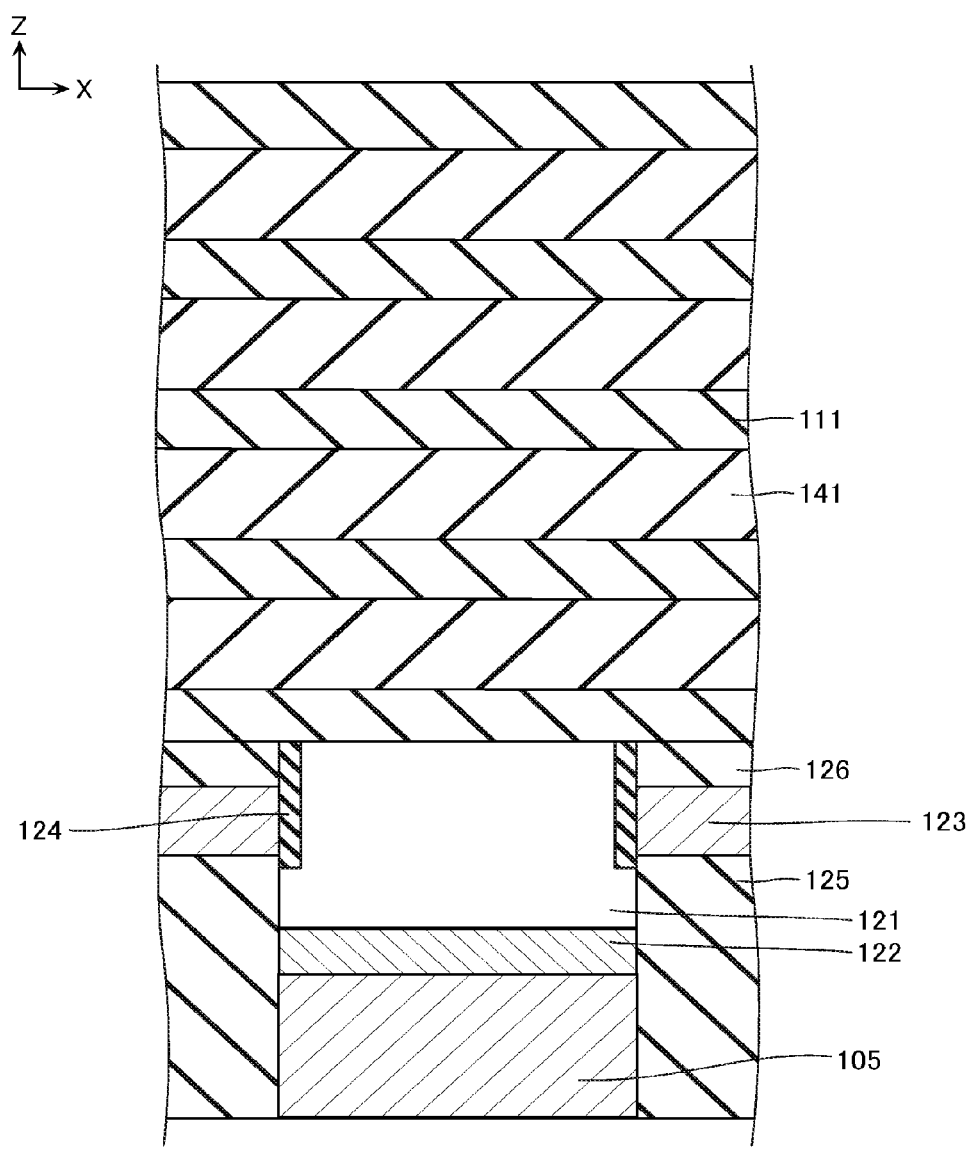

Next, as shown in FIG. 22, the inter-layer insulating layer 111 and a sacrifice layer 141 are alternately deposited above the semiconductor layer 121 and the inter-layer insulating layer 126. The inter-layer insulating layer 111 is formed from an insulating layer of the likes of silicon oxide ($SiO_2$), for example. The sacrifice layer 141 is formed from an insulating layer of the likes of silicon nitride (SiN), for example. Deposition of these layers is performed by a means such as CVD, for example.

Figure 23:
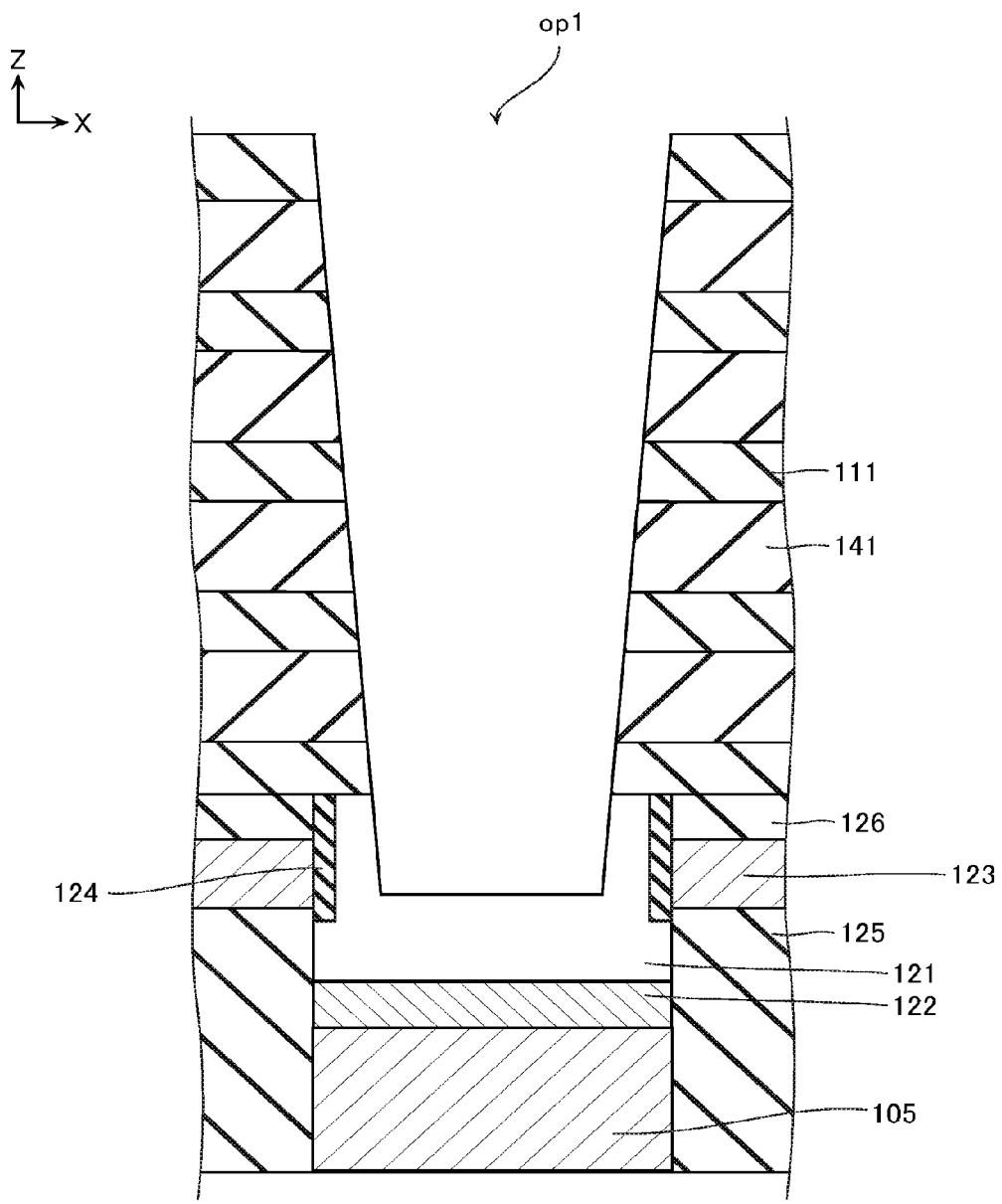

Next, as shown in FIG. 23, the inter-layer insulating layer 111 and the sacrifice layer 141 are divided in the X direction by a means such as RIE, and an opening op1 is formed. Note that although illustration thereof is omitted in FIG. 23, the insulating layer 115 partitioning the opening op1 in the Y direction, of the kind described with reference to FIG. 15, is formed in the opening op1.

Figure 24:
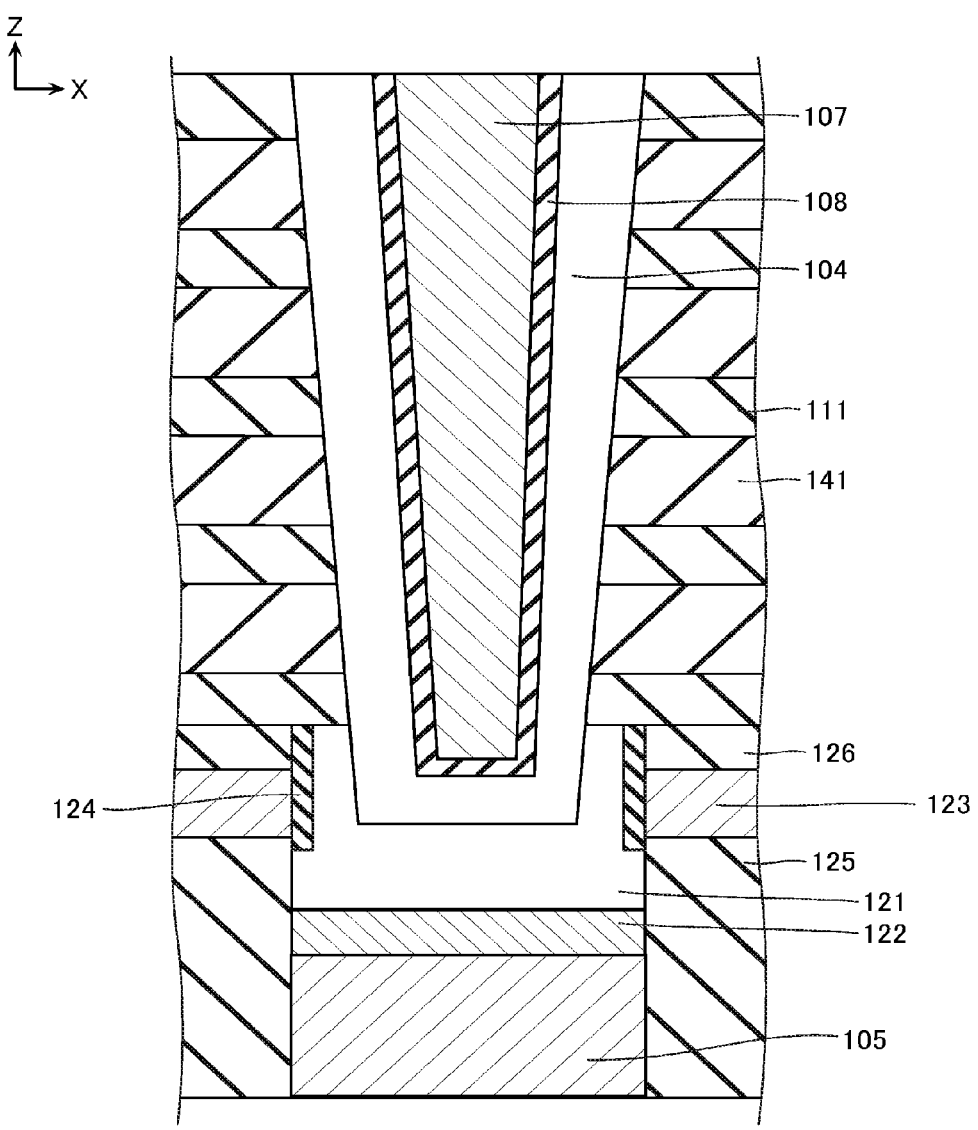

Next, as shown in FIG. 24, the semiconductor layer 104, the gate insulating layer 108, and the gate electrode layer 107 are deposited on the bottom surface and sidewall of the opening op1. The semiconductor layer 104 is formed from the likes of polysilicon, for example. The gate insulating layer 108 is formed from an insulating layer of the likes of silicon oxide ($SiO_2$), for example. The gate electrode layer 107 is formed from the likes of high concentration n+ type polysilicon or titanium nitride (TiN), for example. Deposition of these layers is performed by a means such as CVD, for example.

Figure 25:
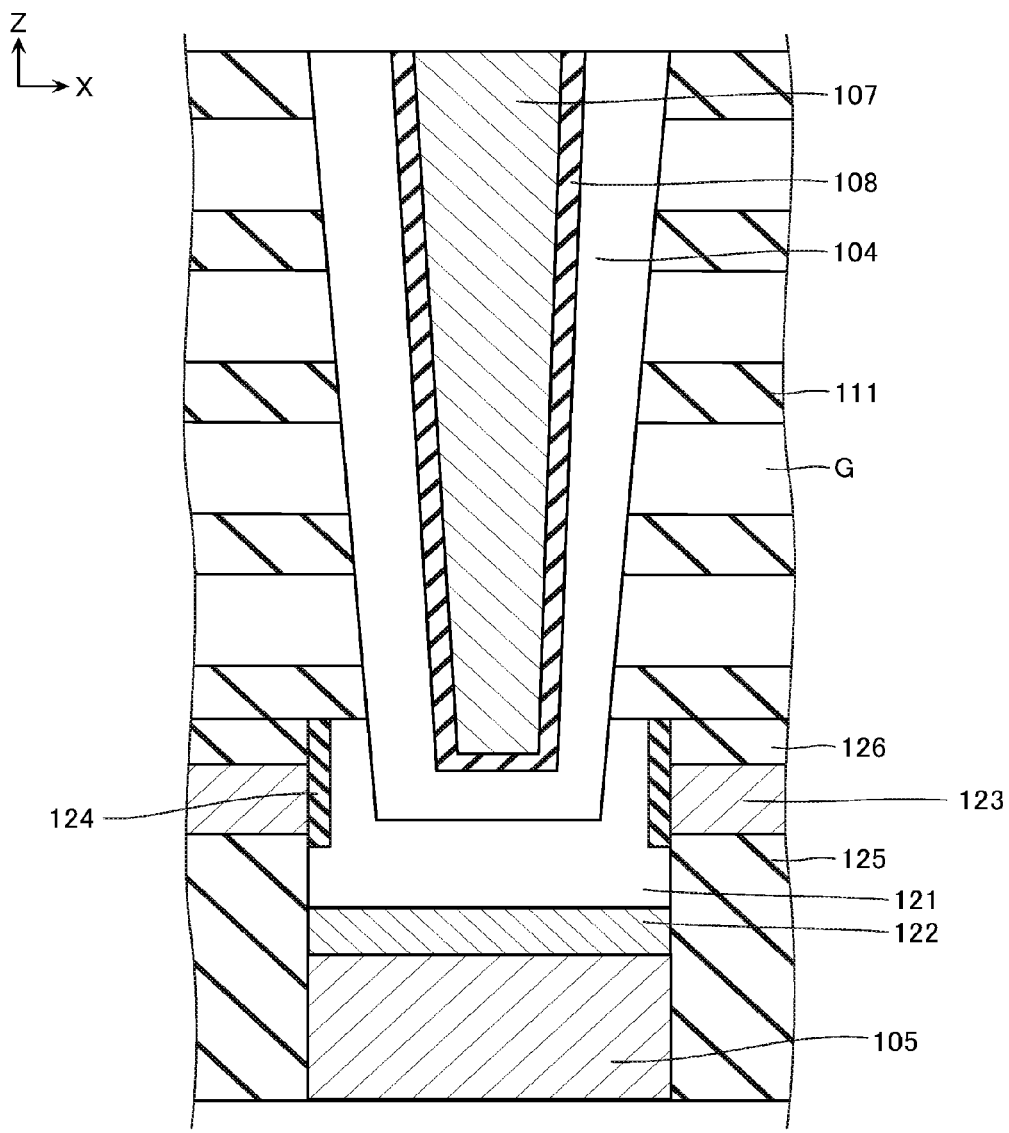

Next, as shown in FIG. 25, the sacrifice layer 141 is removed by a means such as wet etching using phosphoric acid. As a result, a gap G is formed between the inter-layer insulating layers 111 adjacent in the Z direction.

Subsequently, as shown in FIG. 20, the variable resistance layer 203 and the word line conductive layer 102 are sequentially deposited on upper and lower surfaces of the inter-layer insulating layer 111 and a sidewall of the semiconductor layer 104, via this gap G. Deposition of these layers is performed by a means such as CVD, for example. As a result, the memory cell array described with reference to FIG. 20 is manufactured.

Semiconductor Memory Device according to Third Embodiment

Figure 26:
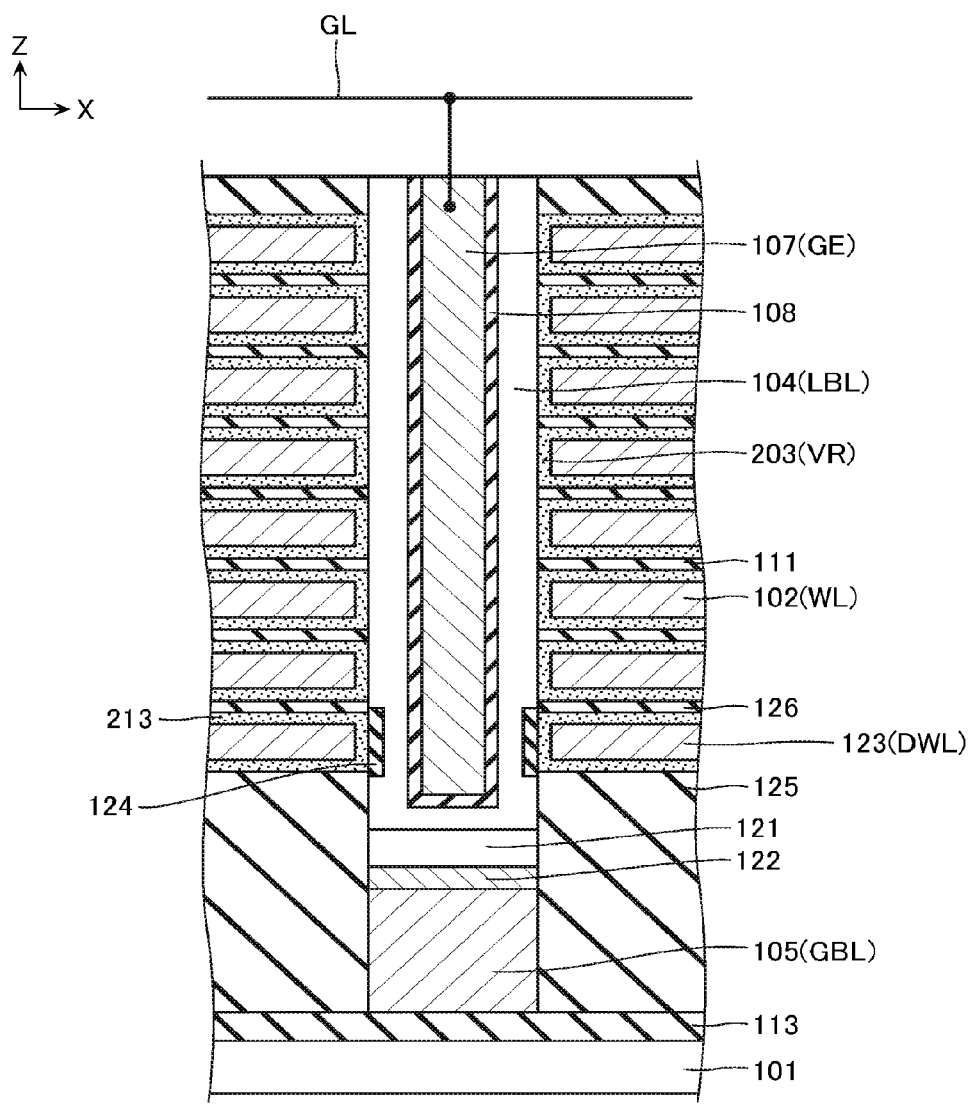
FIG. 26 is a cross-sectional view showing a configuration of part of a nonvolatile semiconductor memory device according to a third embodiment.

Next, a semiconductor memory device according to a third embodiment will be described with reference to FIG. 26. FIG. 26 is a cross-sectional view showing a configuration of part of a memory cell array of the semiconductor memory device according to the present embodiment. Note that in the description below, portions similar to those of the second embodiment will be assigned with identical reference symbols to those assigned in the second embodiment, and descriptions thereof will be omitted.

As shown in FIG. 26, the memory cell array according to the present embodiment is basically configured similarly to the memory cell array according to the second embodiment, but differs in the following point. That is, as shown in FIG. 26, in the present embodiment, a side surface and upper and lower surfaces of the dummy word line conductive layer 123 are covered by an insulating layer 213. The insulating layer 213 may be formed from an identical material to that of the variable resistance layer 203 or may be formed from a different material, such as silicon oxide ($SiO_2$).

The present embodiment results in the dummy gate insulating layer 124 and the insulating layer 213 being provided between the dummy word line conductive layer 123 and the semiconductor layer 104. Therefore, it is possible to more suitably insulate and isolate between the semiconductor layer 104 and the dummy word line conductive layer 123 compared to in the first embodiment and the second embodiment.

Semiconductor Memory Device according to Fourth Embodiment

Figure 27:
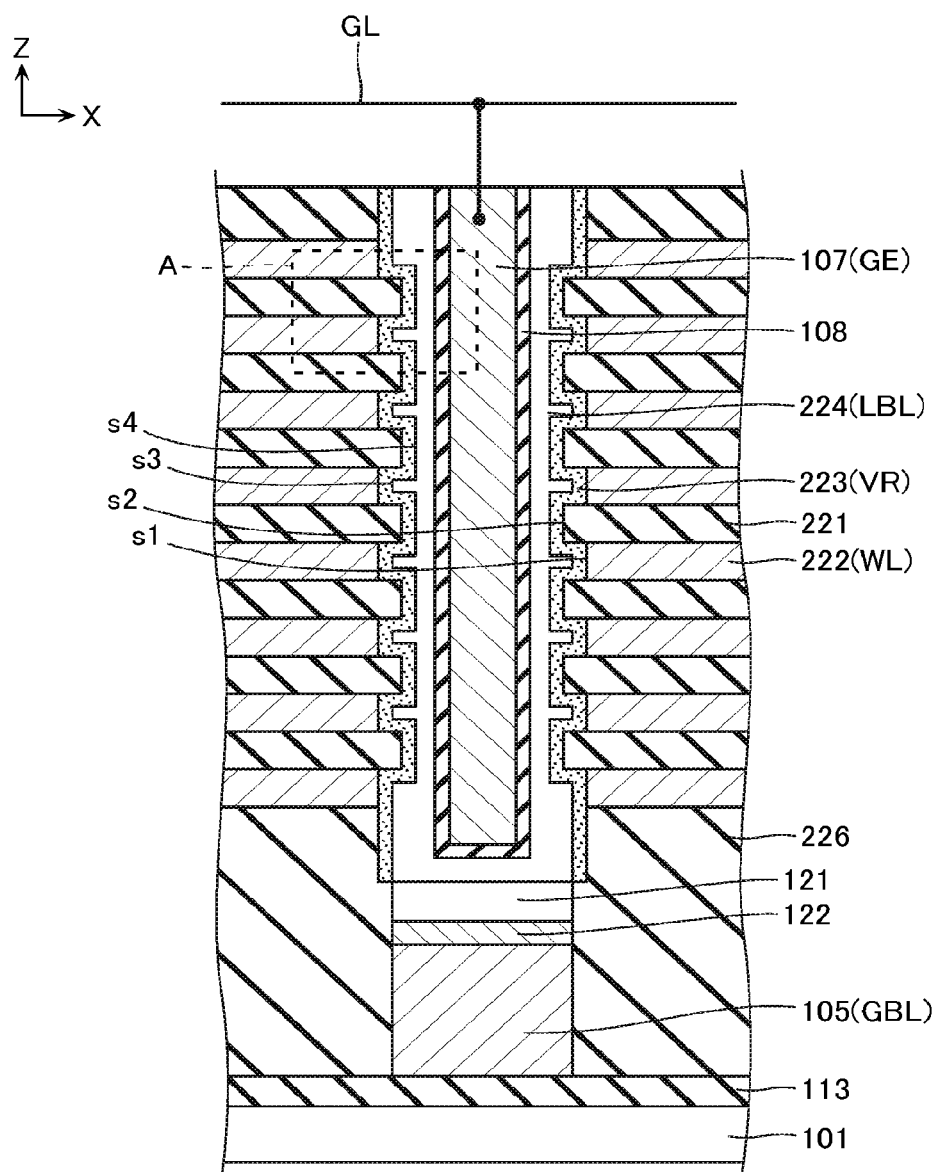
FIG. 27 is a cross-sectional view showing a configuration of part of a nonvolatile semiconductor memory device according to a fourth embodiment.

Next, a semiconductor memory device according to a fourth embodiment will be described with reference to FIG. 27. FIG. 27 is a cross-sectional view showing a configuration of part of a memory cell array of the semiconductor memory device according to the present embodiment. Note that in the description below, portions similar to those of the first embodiment will be assigned with identical reference symbols to those assigned in the first embodiment, and descriptions thereof will be omitted.

As shown in FIG. 27, the memory cell array according to the present embodiment comprises: a plurality of word line conductive layers 222 (word lines WL) stacked above the substrate 101 via an inter-layer insulating layer 221; a variable resistance layer 223 (variable resistance element VR) contacting side surfaces of these plurality of word line conductive layers 222; and a semiconductor layer 224 (local bit line LBL) contacting a side surface of this variable resistance layer 223 and extending in the Z direction. These inter-layer insulating layer 221, word line conductive layer 222, variable resistance layer 223, and semiconductor layer 224 are formed from similar materials to those of the inter-layer insulating layer 111, word line conductive layer 102, variable resistance layer 103, and semiconductor layer 104 according to the first embodiment.

In addition, as shown in FIG. 27, in the present embodiment, a surface s1 facing the semiconductor layer 224 of the word line conductive layer 222 is recessed in the X direction with respect to a surface s2 facing the semiconductor layer 224 of the inter-layer insulating layer 221. Moreover, a surface s3 (first facing portion) facing the word line conductive layer 222 of the semiconductor layer 224 projects in the X direction with respect to a surface s4 (second facing portion) facing the inter-layer insulating 221 of the semiconductor layer 224.

In such a configuration, a distance between the surface s4 (second facing portion) of the semiconductor layer 224 and the word line conductive layer 222 is far, hence it is more difficult for a channel (inversion layer) to be formed in a periphery of the surface s4 (second facing portion) of the semiconductor layer 224, compared to in the first embodiment, for example. Therefore, a channel (inversion layer) formed close to a selected word line WL and a channel (inversion layer) formed close to an unselected word line WL can be suitably divided. Moreover, if concavities and convexities are formed in a surface of the semiconductor layer 224, then it becomes possible for mobility of electrons in the surface of the semiconductor layer 224 to be reduced. This makes it possible for a leak current between the selected word line WL and the unselected word line WL to be suppressed.

Note that as shown in FIG. 27, the memory cell array according to the present embodiment differs from that of the semiconductor memory device according to the first embodiment, and does not comprise the dummy gate insulating layer 124 and the dummy word line conductive layer 123. In addition, an inter-layer insulating layer 226 is implanted downwardly of the word line conductive layer 222. The inter-layer insulating layer 226 is formed from an insulating layer of the likes of silicon oxide ($SiO_2$), for example.

Note that in other respects, the memory cell array according to the present embodiment is configured similarly to the memory cell array 11 according to the first embodiment.

Figure 28:
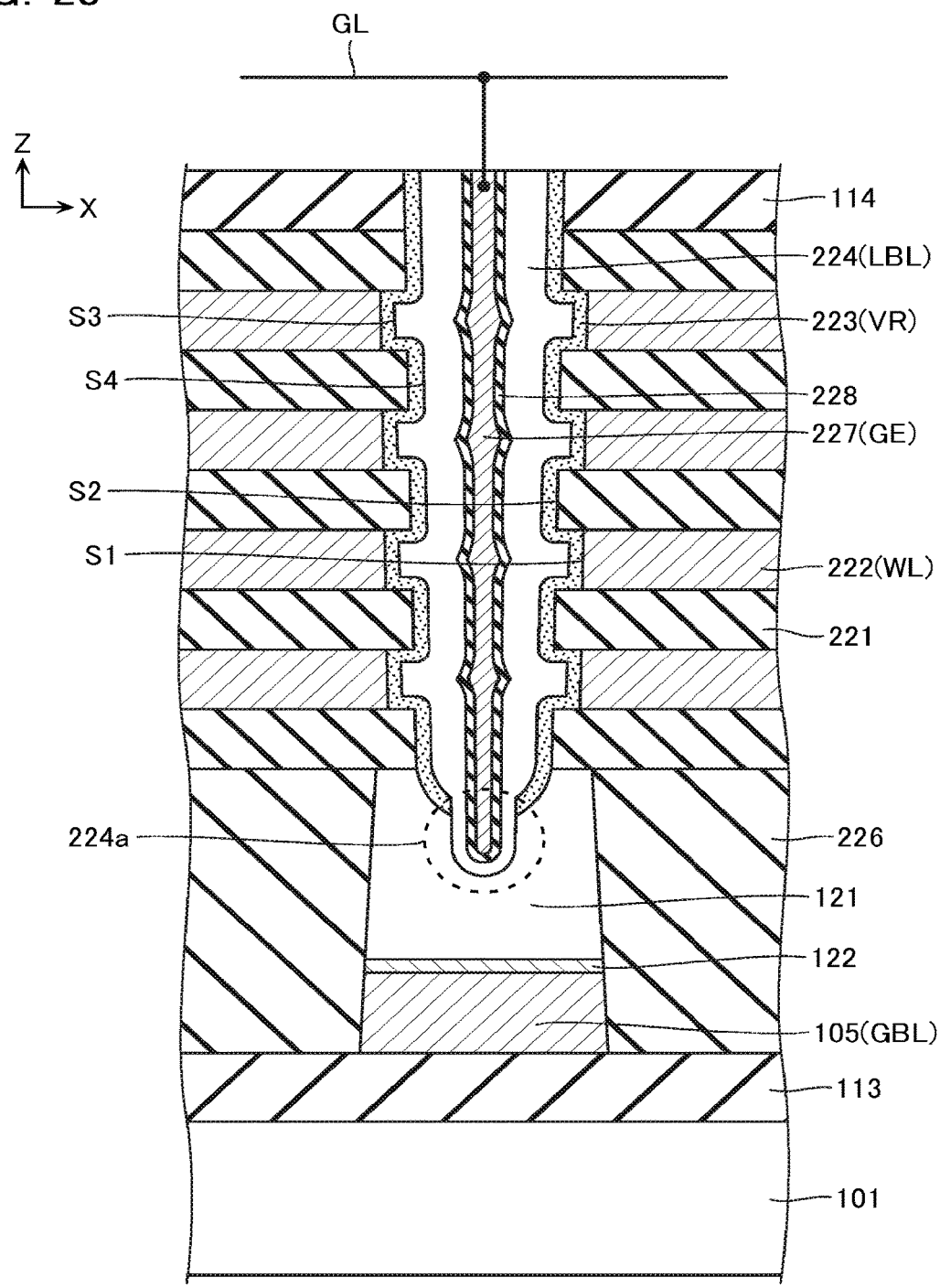
FIG. 28 is a cross-sectional view showing a configuration of part of the same nonvolatile semiconductor memory device.

Note that as shown in FIG. 28, for example, a lower end portion 224a of the semiconductor layer 224 may be positioned more downwardly than the upper surface of the semiconductor layer 121 including an n type impurity. In addition, the semiconductor layer 121 may cover a side surface in the X direction and lower surface of the lower end portion 224a of the semiconductor layer 224. Moreover, not only the variable resistance layer 223 and the semiconductor layer 224, but also a gate insulating layer 228 and a gate electrode layer 227 may be formed concavely-and-convexly along concavities and convexities formed in side surfaces of the plurality of inter-layer insulating layers 221 and the plurality of word line conductive layers 222.

Figure 29:
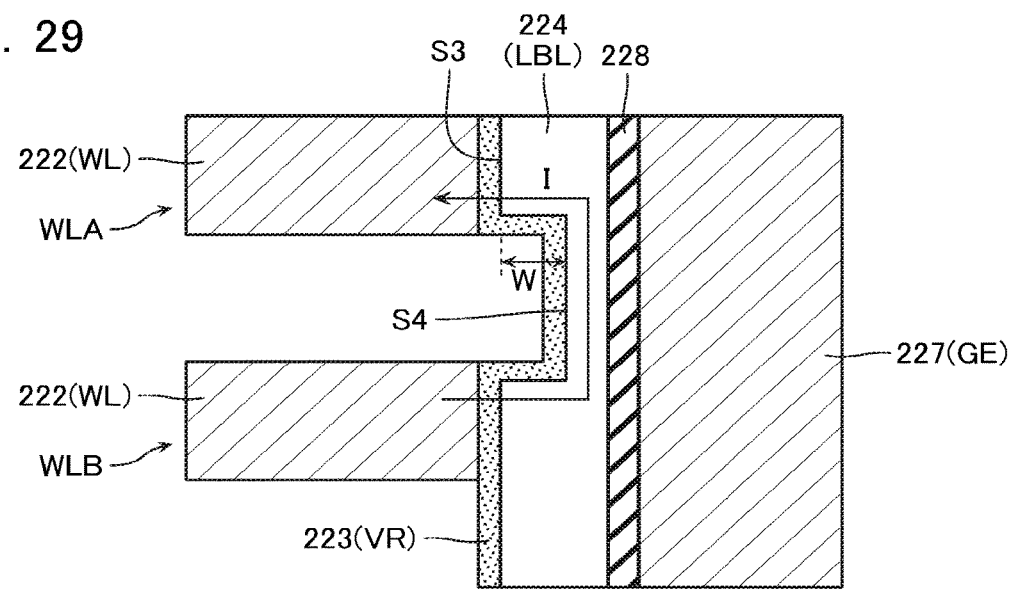
FIG. 29 is a view showing a calculation model used in a calculation about the same nonvolatile semiconductor memory device.
Figure 30:
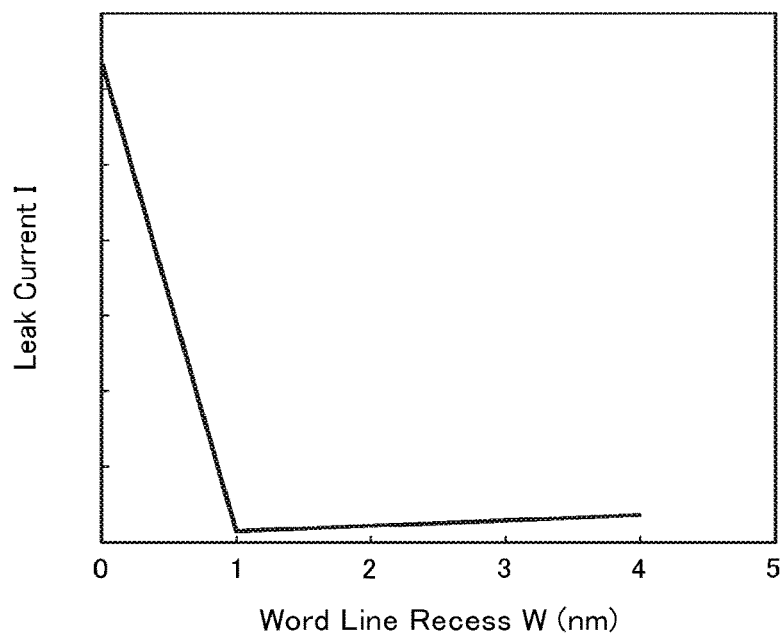
FIG. 30 is a graph showing results of the same calculation.

Next, results of a calculation performed for the memory cell array according to the present embodiment, will be described with reference to FIGS. 29 and 30. FIG. 29 is a view for explaining a calculation model adopted during this calculation. FIG. 30 is a graph showing results of the calculation.

FIG. 29 corresponds to a portion indicated by A in FIG. 27. As shown in FIG. 29, in this calculation, of two word line conductive layers 222 adjacent in the Z direction, one is set as a selected word line WLA and the other is set as an unselected word line WLB, and a leak current when a certain voltage is applied to these selected word line WLA and unselected word line WLB, is calculated. Moreover, in this calculation, such a leak current is calculated for the case where a step difference W between the surface S3 and the surface s4 of the semiconductor layer 224 is 0 nm (the case of no step difference W), for the case where the step difference W is 1 nm, and for the case where the step difference W is 4 nm. Note that in this calculation, an overall film thickness of the semiconductor layer 224 is set to 10 nm.

FIG. 30 is a graph showing results of the calculation, the horizontal axis showing magnitude of the step difference W, and the vertical axis showing magnitude of a leak current I. As shown in FIG. 30, according to results of the calculation, when the step difference W was in a range of about 1 nm to 4 nm, the leak current I was about 10 times less than the leak current in the case where the step difference W is not provided between the surface s3 and the surface s4 of the semiconductor layer 224 (the case where the step difference W is 0 nm). It may be understood from this that the leak current I can be significantly reduced by setting the step difference W between the surface s3 and the surface s4 of the semiconductor layer 224 to 1 nm or more.

Method of Manufacturing according to Fourth Embodiment

Next, a method of manufacturing the semiconductor memory device according to the present embodiment will be described with reference to FIGS. 31 to 35. FIGS. 31 to 35 are perspective views for explaining the same method.

Figure 31:
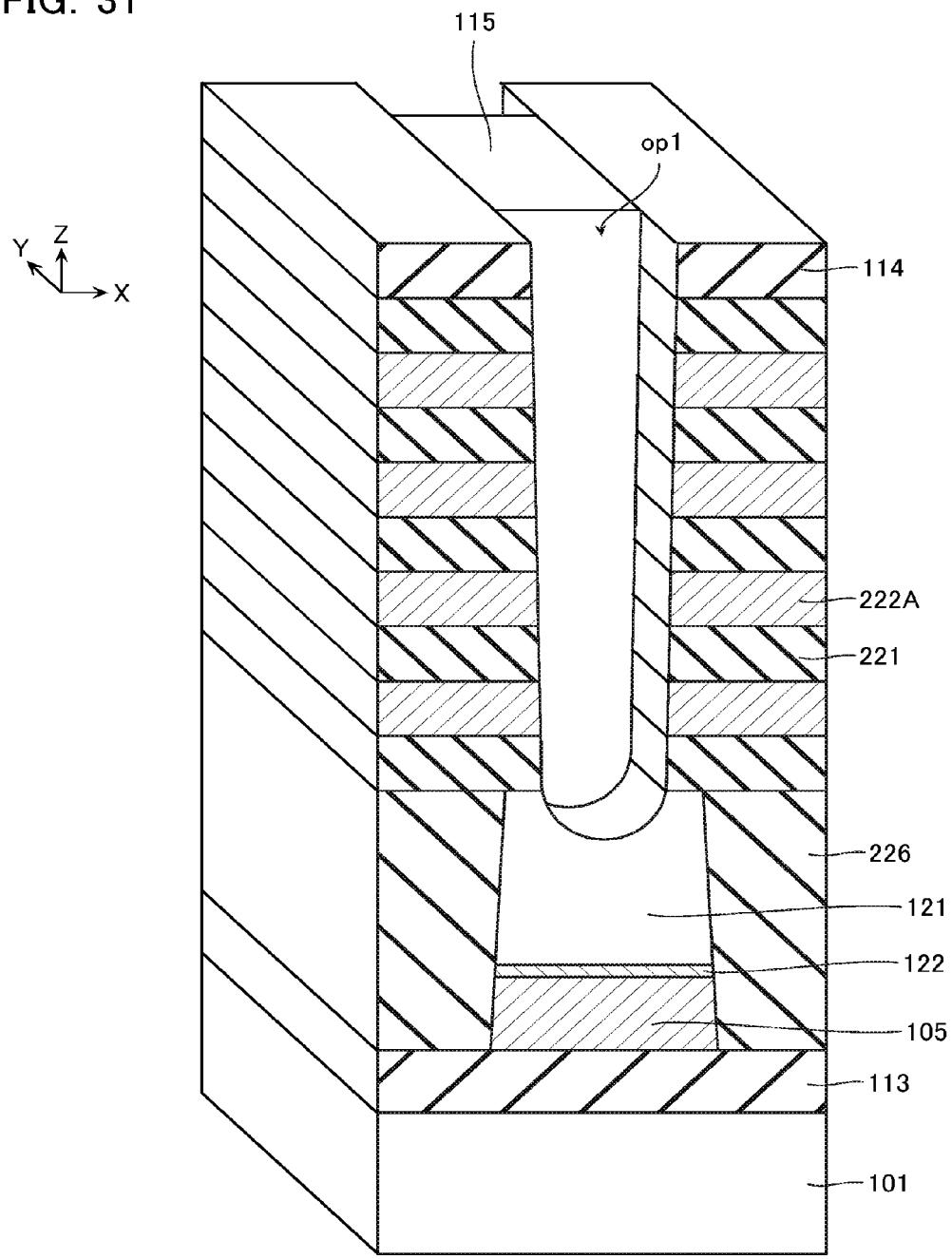
FIGS. 31 to 35 are perspective views for explaining a method of manufacturing the same nonvolatile semiconductor memory device.

In the method of manufacturing according to the present embodiment, as shown in FIG. 31, steps substantially similar to the steps described with reference to FIGS. 8 to 10, are performed. However, as shown in FIG. 31, the inter-layer insulating layer 125 is not formed, and instead, the inter-layer insulating layer 226 is formed. Formation of the inter-layer insulating layer 226 can be performed substantially similarly to in the step described with reference to FIG. 10, but an upper surface of the inter-layer insulating layer 226 is formed at about the same height position as the upper surface of the semiconductor layer 121.

In addition, as shown in FIG. 31, a step substantially similar to the step described with reference to FIG. 14 is performed, and the inter-layer insulating layer 221 and a conductive layer 222A which will form the word line conductive layer 222 are alternately deposited on the semiconductor layer 121 and the inter-layer insulating layer 226, and furthermore, the opening op1 dividing these inter-layer insulating layer 221 and conductive layer 222A in the X direction, is formed. The inter-layer insulating layer 221 is formed from an insulating layer of the likes of silicon oxide ($SiO_2$), for example. The conductive layer 222A is formed from the likes of polysilicon including an n type impurity, for example. Deposition of these layers is performed by a means such as CVD, for example. Moreover, formation of the opening op1 is performed by the likes of RIE using the insulating layer 114 as a mask. In addition, as shown in FIG. 31, the insulating layer 115 partitioning the opening op1 in the Y direction, is formed. The insulating layer 115 is formed by a method such as described with reference to FIG. 15.

Figure 32:
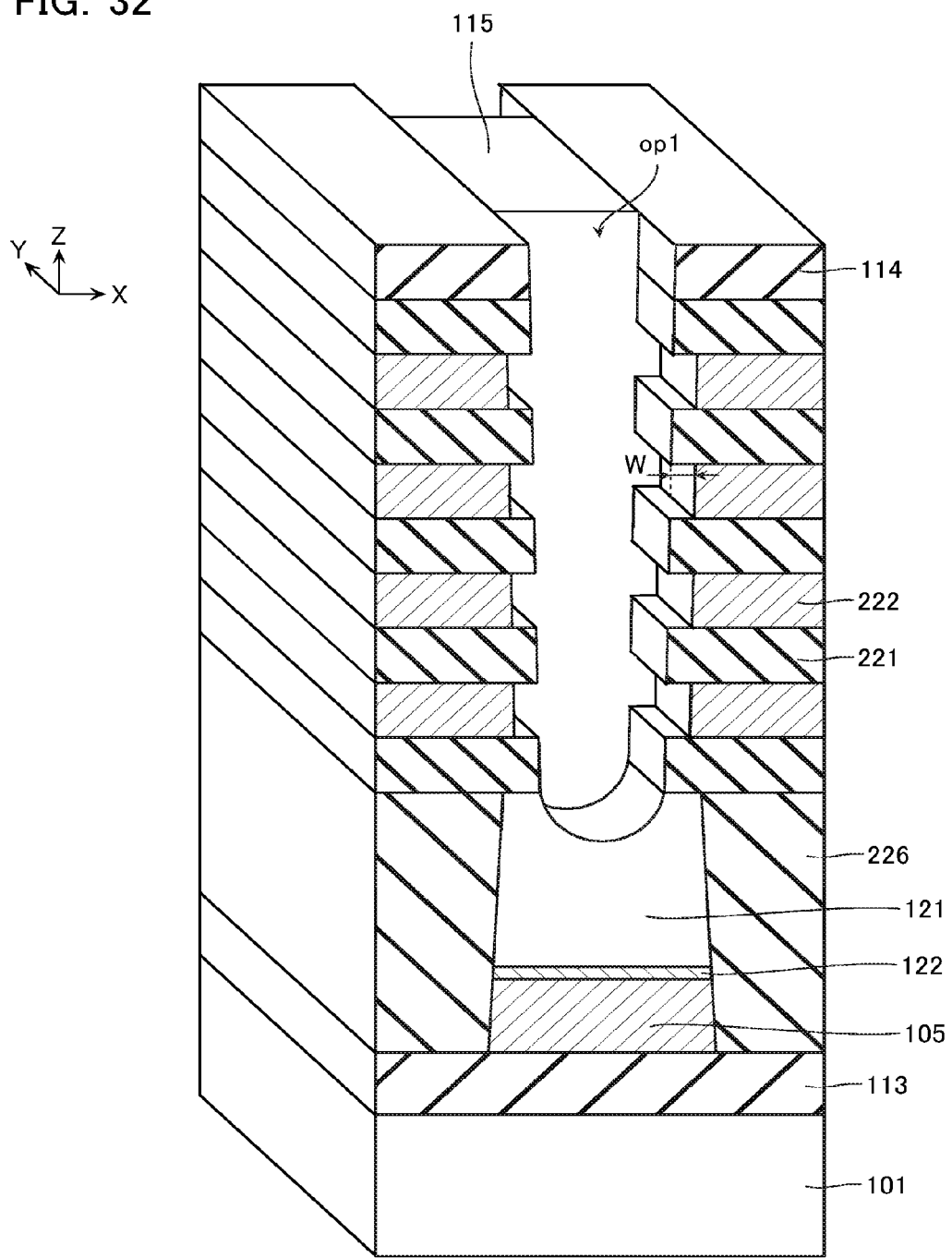

Next, as shown in FIG. 32, part of the conductive layer 222A is removed from the X direction via the opening op1 to form the word line conductive layer 222. This step is performed by a means such as etchback, for example. Due to this step, a step difference of width W is provided in side surfaces in the X direction of the inter-layer insulating layer 221 and the word line conductive layer 222. Moreover, a side surface in the X direction of the opening op1 is formed concavely-and-convexly.

Figure 33:
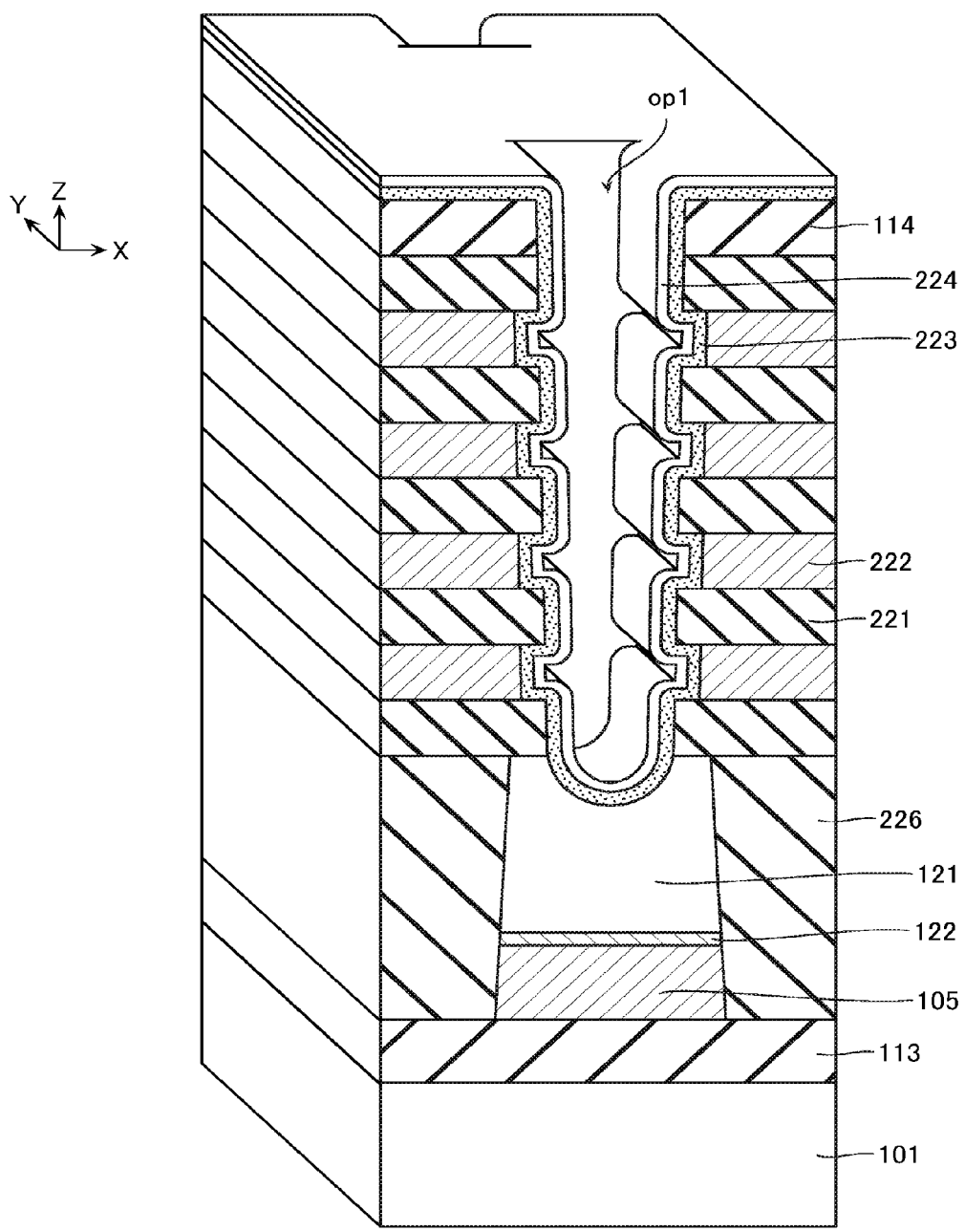

Next, as shown in FIG. 33, the variable resistance layer 223 and part of the semiconductor layer 224 are deposited on the bottom surface and sidewall of the opening op1 and the upper surface of the insulating layer 114. The variable resistance layer 223 is formed from a metal oxide film of the likes of hafnium oxide (HfOx), for example. The semiconductor layer 224 is formed from the likes of polysilicon, for example. Deposition of these layers is performed by a means such as CVD, for example. Now, the variable resistance layer 223 and part of the semiconductor layer 224 are deposited along the sidewall of the opening op1 formed concavely-and-convexly.

Figure 34:
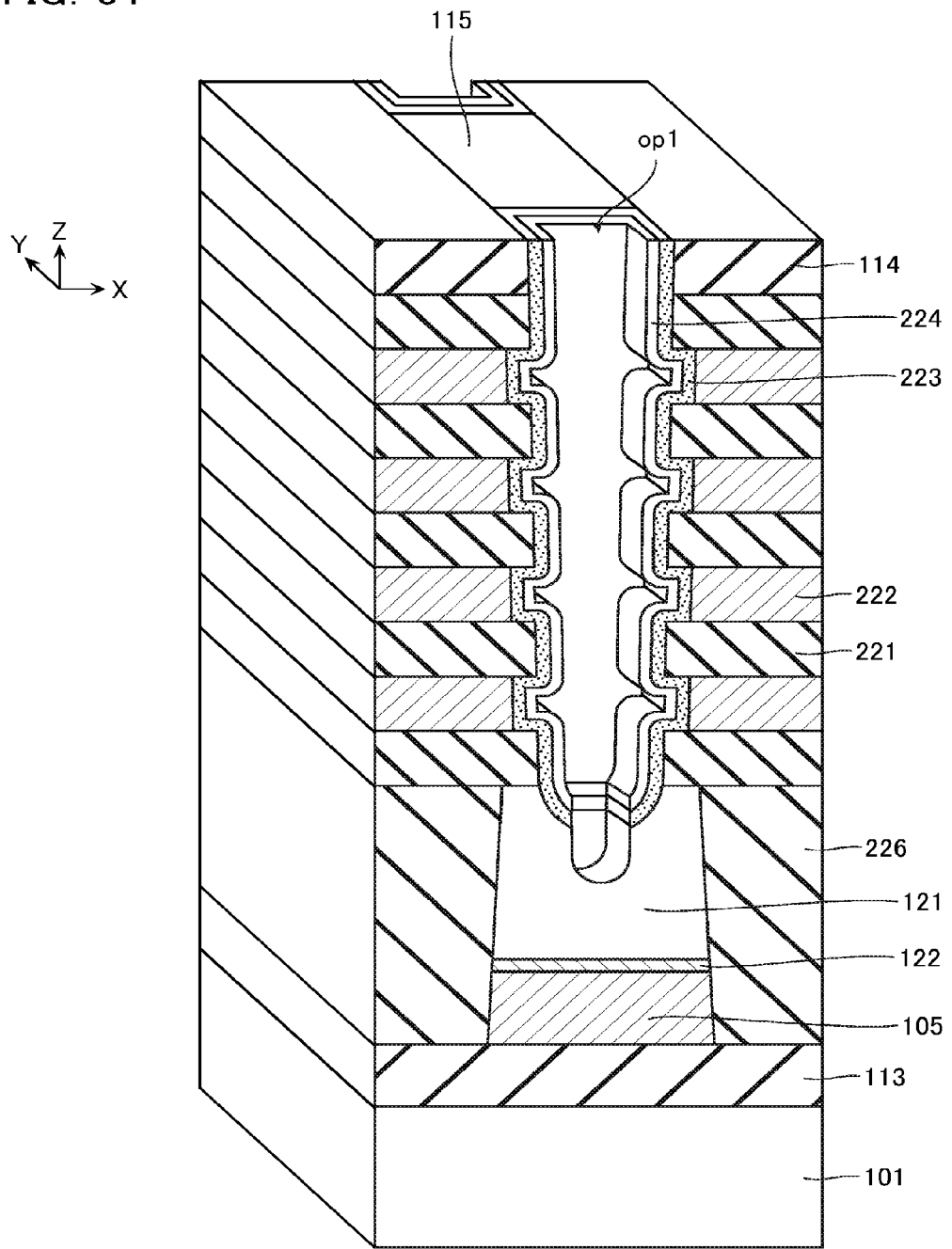

Next, as shown in FIG. 34, portions positioned at the bottom portion of the opening op1 and portions positioned at the upper surface of the insulating layer 114, of the variable resistance layer 223 and the semiconductor layer 224, are removed to expose the semiconductor layer 121 at the bottom surface of the opening op1. Removal of the variable resistance layer 223 and the semiconductor layer 224 is performed by a means such as RIE, for example.

Figure 35:
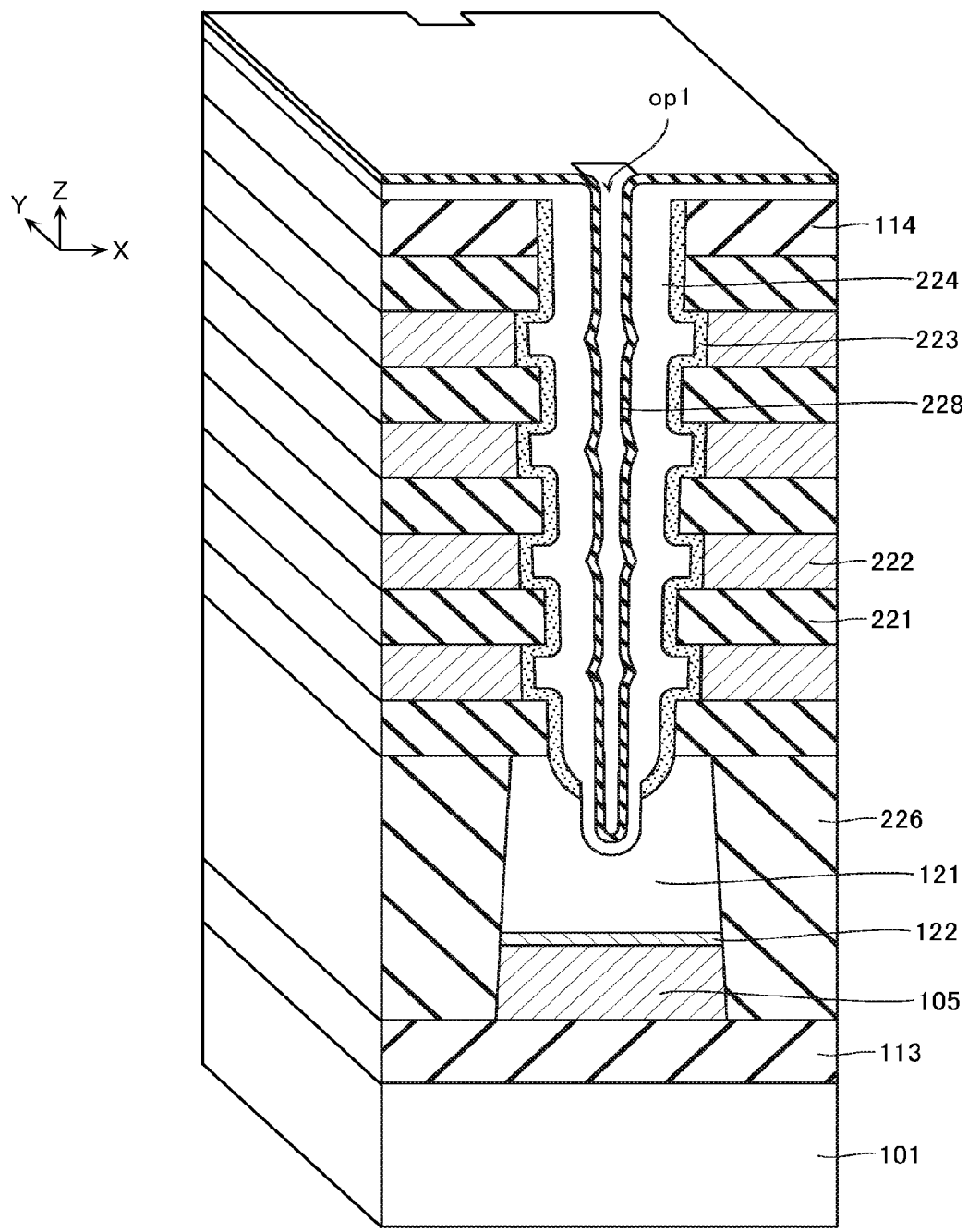

Next, as shown in FIG. 35, the semiconductor layer 224 is further deposited and the gate insulating layer 228 is deposited, on the bottom surface and sidewall of the opening op1 and the upper surface of the insulating layer 114. The gate insulating layer 228 is formed from an insulating layer of the likes of silicon oxide ($SiO_2$), for example. Deposition of these layers is performed by a means such as CVD, for example. Now, the semiconductor layer 224 and the gate insulating layer 228 are deposited along the sidewall of the opening op1 formed concavely-and-convexly.

Next, as shown in FIG. 28, the gate electrode layer 227 is implanted on the inside of the opening op1. The gate electrode layer 227 is formed from the likes of high concentration n+ type polysilicon or titanium nitride (TiN), for example. As a result, the memory cell array described with reference to FIG. 28 is manufactured.

Semiconductor Memory Device According to Fifth Embodiment

Figure 36:
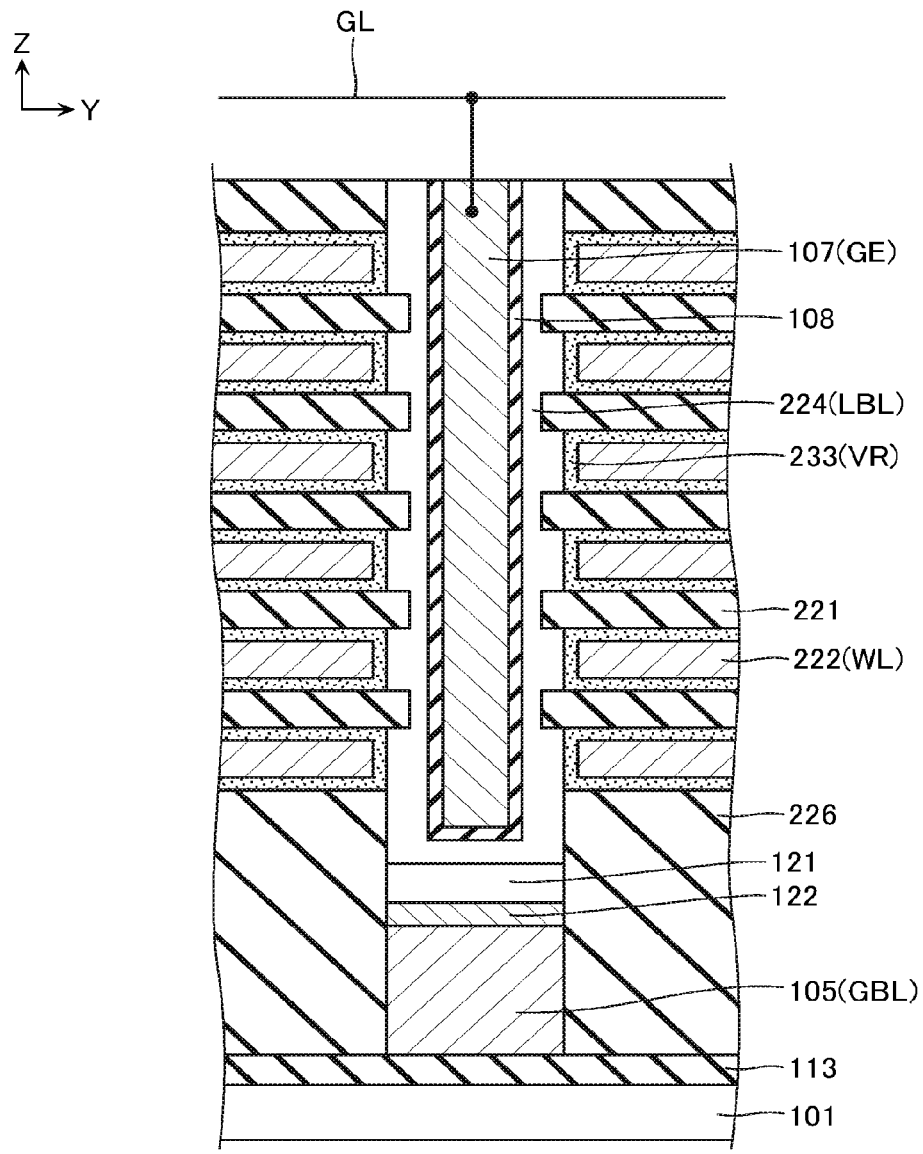
FIG. 36 is a cross-sectional view showing a configuration of part of a nonvolatile semiconductor memory device according to a fifth embodiment.

Next, a semiconductor memory device according to a fifth embodiment will be described with reference to FIG. 36. FIG. 36 is a cross-sectional view showing a configuration of part of a memory cell array of the semiconductor memory device according to the present embodiment. Note that in the description below, portions similar to those of the fourth embodiment will be assigned with identical reference symbols to those assigned in the fourth embodiment, and descriptions thereof will be omitted.

As shown in FIG. 36, the memory cell array according to the present embodiment is basically configured similarly to the memory cell array according to the fourth embodiment, but differs in the following point. That is, in the present embodiment, a plurality of variable resistance layers 233 respectively cover side surfaces, upper surfaces, and lower surfaces of the plurality of word line conductive layers 222, and each functions as the variable resistance element VR (memory cell MC). Note that in other respects, the variable resistance layer 233 according to the present embodiment is configured similarly to the variable resistance layer 223 according to the fourth embodiment.

Semiconductor Memory Device According to Sixth Embodiment

Figure 37:
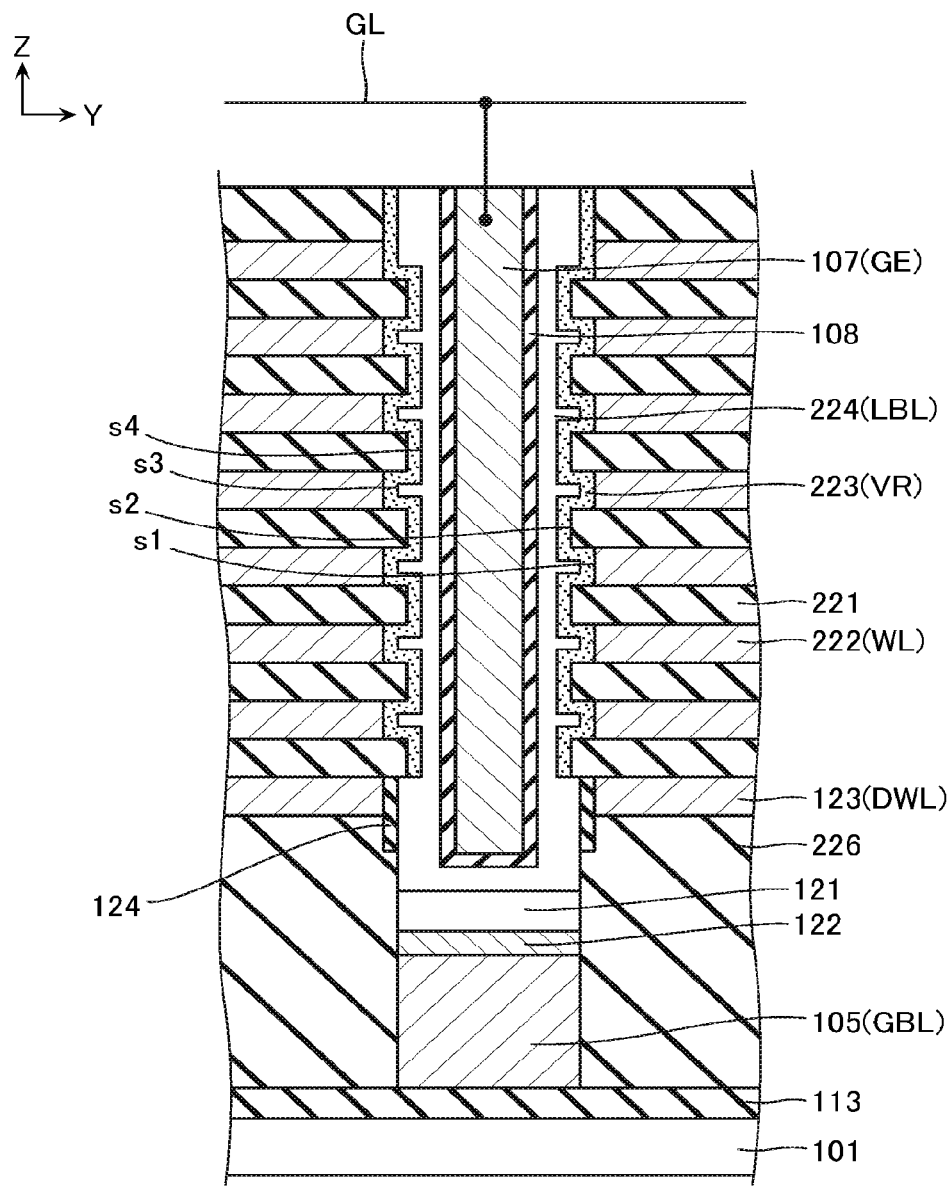
FIG. 37 is a cross-sectional view showing a configuration of part of a nonvolatile semiconductor memory device according to a sixth embodiment.

Next, a semiconductor memory device according to a sixth embodiment will be described with reference to FIG. 37. FIG. 37 is a cross-sectional view showing a configuration of part of a memory cell array of the semiconductor memory device according to the present embodiment. Note that in the description below, portions similar to those of the first embodiment or the fourth embodiment will be assigned with identical reference symbols to those assigned in the first embodiment or the fourth embodiment, and descriptions thereof will be omitted.

As shown in FIG. 37, the memory cell array according to the present embodiment is basically configured similarly to that of the semiconductor memory device according to the first embodiment, but similarly to in the fourth embodiment, the surface s1 facing the semiconductor layer 224 of the word line conductive layer 222 is more recessed in the X direction compared to the surface s2 facing the semiconductor layer 224 of the inter-layer insulating layer 221. Moreover, the surface s3 (first facing portion) facing the word line conductive layer 222 of the semiconductor layer 224 projects in the X direction with respect to the surface s4 (second facing portion) facing the inter-layer insulating 221 of the semiconductor layer 224.

Semiconductor Memory Device According to Seventh Embodiment

Figure 38:
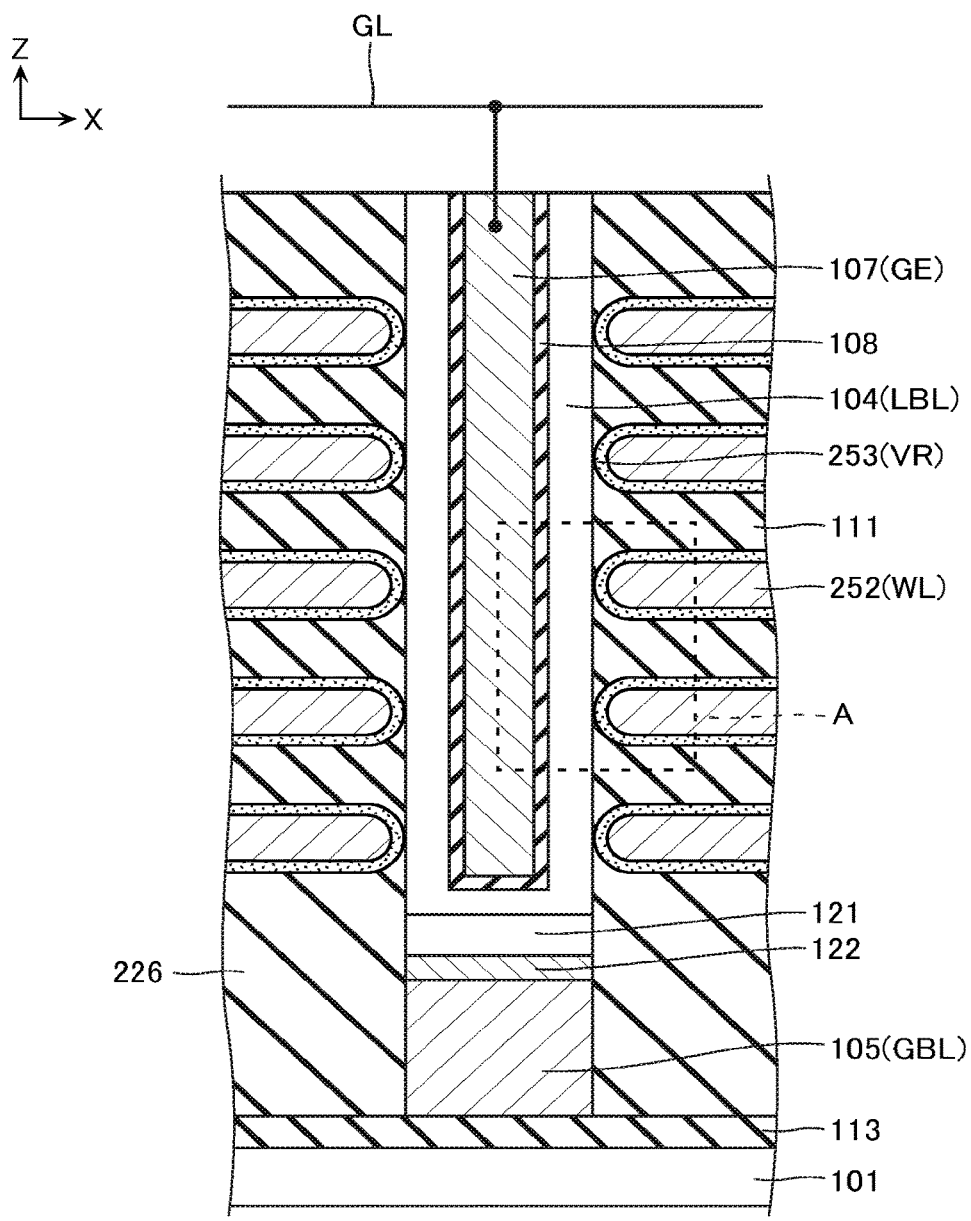
FIG. 38 is a cross-sectional view showing a configuration of part of a nonvolatile semiconductor memory device according to a seventh embodiment.
Figure 39:
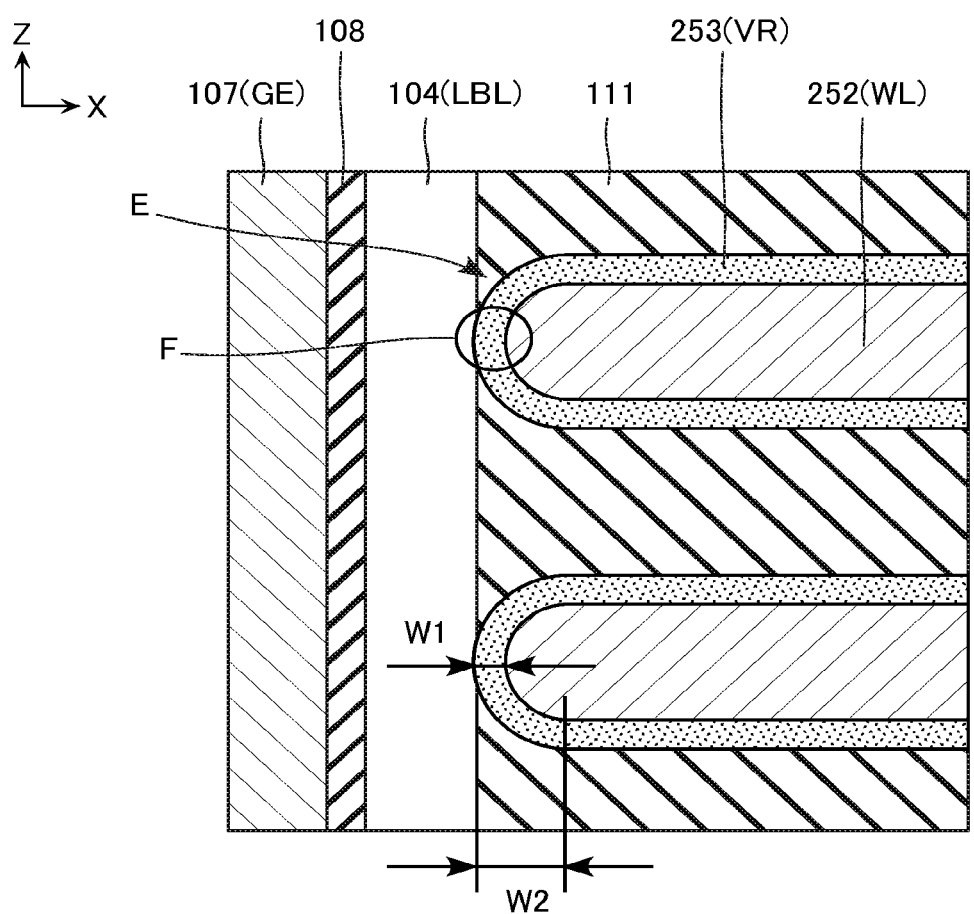
FIG. 39 is a cross-sectional view showing a configuration of part of the nonvolatile semiconductor memory device according to the same embodiment.

Next, a semiconductor memory device according to a seventh embodiment will be described with reference to FIGS. 38 and 39. FIG. 38 is a cross-sectional view showing a configuration of part of a memory cell array of the semiconductor memory device according to the present embodiment. FIG. 39 is a cross-sectional view showing a configuration of part of the same memory cell array, and shows enlarged a portion indicated by A of FIG. 38. Note that in the description below, portions similar to those of the first embodiment will be assigned with identical reference symbols to those assigned in the first embodiment, and descriptions thereof will be omitted.

As shown in FIG. 38, the memory cell array according to the present embodiment is basically configured similarly to the memory cell array 11 according to the first embodiment, and comprises a word line conductive layer 252 and a variable resistance layer 253 configured substantially similarly to the word line conductive layer 102 and the variable resistance layer 103. However, in the present embodiment, as shown in FIG. 39, an end E in the X direction of the word line conductive layer 252 is rounded. As a result, a distance W1 between the semiconductor layer 104 and a central position in the Z direction of the word line conductive layer 252 is shorter than a distance W2 between the semiconductor layer 104 and positions of both ends in the Z direction (upper surface or lower surface) of the word line conductive layer 252.

Now, after manufacturing of the memory cell array, forming is sometimes performed to make the variable resistance layer 253 function as the variable resistance element VR (memory cell MC). In this forming, a voltage is applied (a current is passed) between the word line conductive layer 252 and the semiconductor layer 104 to form a filament (current path) configured from the likes of an oxygen defect, in part of the variable resistance element VR configured from the likes of hafnium oxide.

Now, in the present embodiment, the word line conductive layer 252 is closely adjacent to the semiconductor layer 104 close to the central position in the Z direction (a portion indicated by F, in FIG. 39) of the word line conductive layer 252. Therefore, a shortest path between the word line conductive layer 252 and the semiconductor layer 104 is resultantly positioned close to the central position in the Z direction (the portion indicated by F, in FIG. 39) of the word line conductive layer 252, and it becomes easier for the filament to be formed in such a portion. Therefore, a distance between filaments adjacent in the Z direction can be more extended, whereby a leak current occurring between the selected word line WL and the unselected word line WL can be more suppressed, compared to a case such as where for example the filament gets formed close to an end in the X direction of the upper surface or lower surface of the word line conductive layer 252.

Note that even the present embodiment may comprise the likes of the dummy gate insulating layer 124 configured from an insulating layer of the likes of silicon oxide (SiO$_2$), or the dummy word line conductive layer 123 facing a side surface of the semiconductor layer 104 via this dummy gate insulating layer 124, similarly to the first embodiment. Moreover, the lower end of the gate electrode layer 107 may be positioned more downwardly than the upper surface of the dummy word line conductive layer 123, or the dummy word line conductive layer 123 may be formed in a comb shape.

Moreover, even in the present embodiment, similarly to in the fourth embodiment, a surface facing the semiconductor layer 104 of the word line conductive layer 252 may be recessed in the X direction with respect to the surface facing the semiconductor layer 104 of the inter-layer insulating layer 111. Furthermore, a surface facing the word line conductive layer 252 of the semiconductor layer 104 may be projected in the X direction with respect to the surface facing the inter-layer insulating layer 111 of the semiconductor layer 104.

Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a first semiconductor layer extending in a first direction;
   a first wiring line extending in a second direction intersecting the first direction;
   a variable resistance layer provided between the first wiring line and the first semiconductor layer;
   a first gate electrode extending in the first direction and facing the first semiconductor layer via a first insulating layer; and
   a second gate electrode provided in the first direction with respect to the first wiring line, extending in the second direction in parallel to the first wiring line, and facing the first semiconductor layer,
   the second gate electrode facing the first semiconductor layer via a second insulating layer, and facing the first gate electrode via the second insulating layer, the first semiconductor layer, and the first insulating layer.

2. The semiconductor memory device according to claim 1, wherein
   one end in the first direction of the first gate electrode is positioned between one end in the first direction and another end on an opposite side in the first direction, of the second gate electrode.

3. The semiconductor memory device according to claim 1, wherein
   the first direction is a direction crossing a substrate, and
   a lower end on a substrate side of the first gate electrode is positioned more downwardly than an upper surface of the second gate electrode.

4. The semiconductor memory device according to claim 1, wherein
   the second gate electrode is formed in a comb shape.

5. The semiconductor memory device according to claim 3, further comprising
   a second semiconductor layer connected to a lower end portion of the first semiconductor layer,
   wherein an impurity concentration in the second semiconductor layer is higher than an impurity concentration in the first semiconductor layer,
   the second semiconductor layer covers a side surface and lower surface of the lower end portion of the first semiconductor layer, and
   second insulating layer is provided on a side surface of the second semiconductor layer.

6. The semiconductor memory device according to claim 1, further comprising
   a plurality of the first wiring lines arranged in the first direction,
   wherein the first semiconductor layer comprises: a first facing portion facing the first wiring line; and a second facing portion facing an inter-layer insulating layer provided between the first wiring lines, and
   the first facing portion projects with respect to the second facing portion.

7. The semiconductor memory device according to claim 6, wherein
   the first facing portion projects 1 nm or more with respect to the second facing portion.

8. The semiconductor memory device according to claim 6, wherein
   a surface facing the first semiconductor layer of the first wiring line is recessed with respect to a surface facing the first semiconductor layer of the inter-layer insulating layer, and
   the first semiconductor layer, the first insulating layer, and the first gate electrode are formed concavely-and-convexly along side surfaces of the first wiring line and the inter-layer insulating layer.

9. The semiconductor memory device according to claim 1, wherein
a distance between the first semiconductor layer and a central position in the first direction of the first wiring line is shorter than a distance between the first semiconductor layer and positions of both ends in the first direction of the first wiring line.

10. The semiconductor memory device according to claim 1, further comprising
a plurality of the first wiring lines arranged in the first direction,
wherein the variable resistance layer is provided commonly between a plurality of the first wiring lines and the first semiconductor layer.

11. The semiconductor memory device according to claim 1, further comprising:
a plurality of the first wiring lines arranged in the first direction; and
a plurality of the variable resistance layers arranged in the first direction, wherein
the plurality of variable resistance layers are respectively provided between the first wiring lines and the first semiconductor layer.

12. A semiconductor memory device, comprising:
a first semiconductor layer extending in a first direction;
a plurality of first wiring lines arranged in the first direction and extending in a second direction intersecting the first direction;
a variable resistance layer provided between the first wiring line and the first semiconductor layer; and
a first gate electrode extending in the first direction and facing the first semiconductor layer via a first insulating layer,
the first semiconductor layer comprising: a first facing portion facing the first wiring line; and a second facing portion facing an inter-layer insulating layer provided between the first wiring lines, and
the first facing portion projecting with respect to the second facing portion.

13. The semiconductor memory device according to claim 12, further comprising
a second gate electrode provided in the first direction with respect to the first wiring line, extending in the second direction in parallel to the first wiring line, and facing the first semiconductor layer,
wherein one end in the first direction of the first gate electrode is positioned between one end in the first direction and another end on an opposite side in the first direction, of the second gate electrode.

14. The semiconductor memory device according to claim 12, wherein
the first direction is a direction crossing a substrate,
the semiconductor memory device further comprises a second gate electrode provided on a substrate side with respect to the first wiring line, extending in the second direction in parallel to the first wiring line, and facing the first semiconductor layer, and
a lower end on a substrate side of the first gate electrode is positioned more downwardly than an upper surface of the second gate electrode.

15. The semiconductor memory device according to claim 12, further comprising
a second gate electrode provided in the first direction with respect to the first wiring line, extending in the second direction in parallel to the first wiring line, and facing the first semiconductor layer,
wherein the second gate electrode is formed in a comb shape.

16. The semiconductor memory device according to claim 12, wherein
the first facing portion projects 1 nm or more with respect to the second facing portion.

17. The semiconductor memory device according to claim 12, wherein
a surface facing the first semiconductor layer of the first wiring line is recessed with respect to a surface facing the first semiconductor layer of the inter-layer insulating layer, and
the first semiconductor layer, the first insulating layer, and the first gate electrode are formed concavely-and-convexly along side surfaces of the first wiring line and the inter-layer insulating layer.

18. The semiconductor memory device according to claim 12, wherein
a distance between the first semiconductor layer and a central position in the first direction of the first wiring line is shorter than a distance between the first semiconductor layer and positions of both ends in the first direction of the first wiring line.

19. The semiconductor memory device according to claim 12, further comprising:
a plurality of variable resistance layers arranged in the first direction, and
the plurality of variable resistance layers are respectively provided between the first wiring lines and the first semiconductor layer.

20. A semiconductor memory device, comprising:
a first semiconductor layer extending in a first direction;
a first wiring line extending in a second direction intersecting the first direction;
a variable resistance layer provided between the first wiring line and the first semiconductor layer; and
a first gate electrode extending in the first direction and facing the first semiconductor layer via a first insulating layer,
a distance between the first semiconductor layer and a central position in the first direction of the first wiring line being shorter than a distance between the first semiconductor layer and an upper surface or lower surface of the first wiring line.

* * * * *